US008803616B2

(12) United States Patent
Zhang

(10) Patent No.: US 8,803,616 B2
(45) Date of Patent: Aug. 12, 2014

(54) TEMPERATURE COMPENSATION AND COARSE TUNE BANK SWITCHES IN A LOW PHASE NOISE VCO

(75) Inventor: Gang Zhang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/039,772

(22) Filed: Mar. 3, 2011

(65) Prior Publication Data

US 2012/0223771 A1 Sep. 6, 2012

(51) Int. Cl.
*H03C 3/09* (2006.01)
*H03B 5/12* (2006.01)

(52) U.S. Cl.
USPC ........ 331/36 C; 331/66; 331/115; 331/117 R; 331/167; 331/176; 331/177 V; 331/177 R

(58) Field of Classification Search
USPC .......... 331/36 C, 66, 176, 177 V, 177 R, 167, 331/117 R, 115
See application file for complete search history.

(56) References Cited

U.S. PATENT DOCUMENTS

| 7,084,713 | B2 | 8/2006 | Peluso |
| 7,292,115 | B2* | 11/2007 | Soltanian et al. ............. 331/167 |
| 7,573,347 | B2 | 8/2009 | Mayer et al. |
| 7,772,934 | B2 | 8/2010 | Vancorenland et al. |
| 8,044,720 | B2* | 10/2011 | Kunishima et al. ........... 330/254 |
| 2005/0077970 | A1 | 4/2005 | Da Dalt et al. |
| 2005/0184812 | A1* | 8/2005 | Cho ............................. 331/36 C |
| 2005/0190002 | A1* | 9/2005 | Takinami et al. .......... 331/117 R |
| 2005/0231297 | A1* | 10/2005 | Aparin et al. ............. 331/177 V |
| 2007/0010225 | A1* | 1/2007 | Oosawa et al. ................ 455/255 |
| 2007/0054629 | A1 | 3/2007 | Maligeorgos et al. |
| 2007/0085620 | A1 | 4/2007 | Ohkubo et al. |
| 2007/0146082 | A1* | 6/2007 | Ohara et al. .................... 331/16 |
| 2009/0134947 | A1* | 5/2009 | Tarng ...................... 331/116 FE |
| 2009/0261917 | A1* | 10/2009 | Taghivand et al. .......... 331/36 C |

FOREIGN PATENT DOCUMENTS

WO 2005104347 A1 11/2005

OTHER PUBLICATIONS

Tiebout, "Low-Power Low-Phase-Noise Differentially Tuned Quadrature VCO Design in Standard CMOS", IEEE Journal of Solid-State Circuits, pp. 1018-1024, vol. 36, No. 7, Jul. 2001.
International Search Report and Written Opinion—PCT/US2012/027603—ISA/EPO—Sep. 5, 2012.

* cited by examiner

*Primary Examiner* — Arnold Kinkead
*Assistant Examiner* — Richard Tan
(74) *Attorney, Agent, or Firm* — Kenyon S. Jenckes

(57) ABSTRACT

The LC tank of a VCO includes a main varactor circuit and temperature compensation varactor circuit coupled in parallel with the main varactor circuit. The main varactor is used for fine tuning. The temperature compensation varactor circuit has a capacitance-voltage characteristic that differs from a capacitance-voltage characteristic of the main varactor circuit such that the effects of common mode noise across the two varactor circuits are minimized. The LC tank also has a plurality of switchable capacitor circuits provided for coarse tuning. To prevent breakdown of the main thin oxide switch in each of the switchable capacitor circuits, each switchable capacitor circuit has a capacitive voltage divider circuit that reduces the voltage across the main thin oxide switch when the main switch is off.

54 Claims, 15 Drawing Sheets

LC TANK OF VCO WITH TEMPERATURE COMPENSATION VARACTORS OF THE SAME CONDUCTIVITY TYPE

COARSE TUNE SWITCH
CIRCUIT WITH A THICK OXIDE
TRANSISTOR

COARSE TUNE SWITCH CIRCUIT
WITH TWO THIN-OXIDE
TRANSISTORS

LOCAL OSCILLATOR WITH LOW PHASE NOISE
MULTI-MODE VCO

LC TANK OF VCO WITH TEMPERATURE COMPENSATION
VARACTORS OF AN OPPOSITE CONDUCTIVITY TYPE

MAIN VARACTOR CIRCUIT

TEMPERATURE COMPENSATION VARACTOR CIRCUIT

VOLTAGE ACROSS MAIN VARACTOR = (VA - VTUNE)
VOLTAGE ACROSS TEMPERATURE COMPENSATION VARACTOR = (VA - CTAT)

CAPACITANCE-VOLTAGE VARIATION CHARACTERISTIC
OF THE VARACTORS

CAPACITANCE-VOLTAGE VARIATION CHARACTERISTIC
OF THE VARACTOR CIRCUITS

CHANGE OF CAPACITANCES OF THE VARACTORS
DUE TO AN INCREASE IN VBIAS

CHANGE OF CAPACITANCES OF THE VARACTORS
DUE TO AN INCREASE IN VBIAS

LC TANK OF VCO WITH TEMPERATURE COMPENSATION
VARACTORS OF THE SAME CONDUCTIVITY TYPE

PHASE NOISE VERSUS FREQUENCY

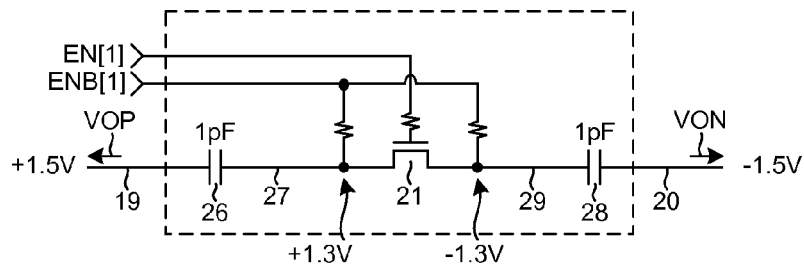
**CONVENTIONAL COARSE TUNE
SWITCHABLE CAPACITOR CIRCUIT**
FIG. 19
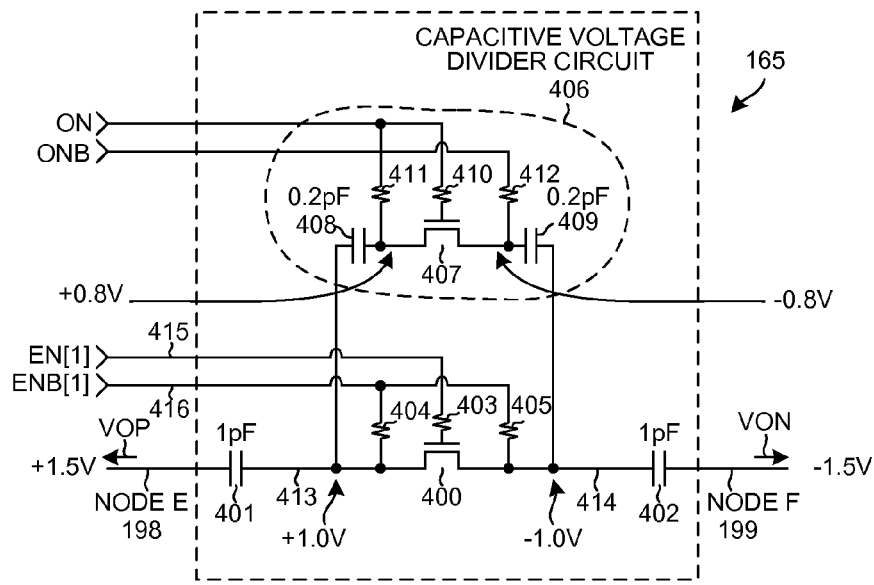
**HIGH BREAKDOWN VOLTAGE COARSE TUNE
SWITCHABLE CAPACITOR CIRCUIT**
FIG. 20
| | CONVENTIONAL COARSE TUNE SWITCHABLE CAPACITOR CIRCUIT (PRIOR ART) FIG. 2 | HIGH BREAKDOWN VOLTAGE COARSE TUNE SWITCHABLE CAPACITOR CIRCUIT FIG. 20 |
|---|---|---|
| MAXIMUM VOLTAGE ACROSS MAIN SWITCH (MAIN SWITCH OFF) | 2.6V | 2.0V |
| MAIN SWITCH S-D OFF CAPACITANCE | 1.0 PF | 1.0 PF |
FIG. 21

| | ON | EN | SIMPLIFIED SWITCHABLE CAPACITOR CIRCUIT | VDS VOLTAGE DROP ACROSS MAIN TRANSISTOR | CAP BETWEEN NODES A AND B |
|---|---|---|---|---|---|
| FIRST MODE (HV MODE) | "1" | "0" | ON="1"; C3, C4, EN, C1 +1.5V A—S C5 D—B C2 −1.5V | $1.5\left(\dfrac{C1}{C1+C3+2C5}\right)+1.5\left(\dfrac{C2}{C2+C4+2C5}\right)$  2.0 Volts (REDUCED VOLTAGE DROP ACROSS MAIN TRANSISTOR DUE TO CAPACITIVE VOLTAGE DIVIDER EFFECT) | 0.1pF |
| FIRST MODE (HV MODE) | "1" | "1" | ON="1"; C3, C4, EN, C1 +1.5V A — B C2 −1.5V | 0 Volts | 0.5pF |
| SECOND MODE (LV MODE) | "0" | "0" | ON="0"; C3, C4, EN, C1 +1.5V A—S C5 D—B C2 −1.5V | $1.5\left(\dfrac{C1}{C1+2C5}\right)+1.5\left(\dfrac{C2}{C2+2C5}\right)$  2.6 Volts | 0.02pF |
| SECOND MODE (LV MODE) | "0" | "1" | ON="0"; C3, C4, EN, C1 +1.5V A—S D—B C2 −1.5V | 0 Volts | 0.5pF |

FIG. 23

SWITCHABLE CAPACITOR CIRCUIT WITH FIXED
CAPACITOR VOLTAGE DIVIDER

TEMPERATURE COMPENSATION AND COARSE TUNE BANK SWITCHES IN A LOW PHASE NOISE VCO

BACKGROUND INFORMATION

1. Technical Field

The disclosed embodiments relate generally to varactor circuits for fine tuning and/or to switchable capacitor circuits for coarse tuning in Voltage-Controlled Oscillators (VCOs).

2. Background Information

FIG. 1 (Prior Art) is a symbol of a Voltage Controlled Oscillator (VCO) 1. FIG. 2 (Prior Art) is a more detailed diagram of the VCO 1 of FIG. 1. VCO 1 includes an LC tank 2. The natural resonant frequency of the LC tank 2 largely determines the oscillating frequency of the differential VCO output signal output by the VCO 1 onto differential output conductors 3 and 4. In the illustrated example, the inductance of the LC tank 2 is provided by inductor 5. The capacitance of the LC tank 2 is provided by a combination of capacitance elements including a varactor circuit 6 and a coarse tune capacitor bank 7. The coarse tune capacitor bank 7 is made up of a number of parallel-connected switchable capacitor circuits. Reference numeral 25 identifies one switchable capacitor circuit. By changing the digital input signals EN[1:N] and ENB[1:N] supplied via input conductors 14 and 15 to the coarse tune capacitor bank 7, capacitances provided by individual ones of the switchable capacitor circuits can be selectively switched into and out of the LC tank 2. Switching out switchable capacitor circuits decreases the overall capacitance of the LC tank 2, thereby increasing VCO 1 oscillating frequency. Switching capacitor element into the LC tank 2 increases the overall capacitance of the LC tank 2, thereby decreasing VCO 1 oscillating frequency.

Fine tuning of the capacitance of the LC tank 2 is accomplished by adjusting a fine tune analog input signal VTUNE on input lead 8. The fine tune analog input signal VTUNE affects a voltage across varactors 9 and 10 and this fine tunes the capacitance of the LC tank 2. How VTUNE affects the varactors 9 and 10 is determined by how the varactors are biased. In one example, increasing VTUNE decreases the voltage across the main varactors, thereby decreasing the capacitance provided by the main varactors 9 and 10, and thereby increasing the VCO 1 oscillating frequency. Conversely, decreasing VTUNE results in increasing the voltage across the main varactors, thereby increasing the capacitance provided by the main varactors 9 and 10, thereby decreasing the VCO 1 oscillating frequency.

It is desired that the oscillating frequency of the VCO 1 be a function of VTUNE and of the coarse tune digital input signals EN[1:N] and ENB[1:N], and be substantially independent of temperature. If, however, there were no temperature compensation circuitry provided, then for a given fixed VTUNE voltage the oscillating frequency of the VCO 1 would be seen to decrease with increasing temperature due to the capacitances of the main varactors 9 and 10 increasing with increasing temperature. To compensate for this, the VCO 1 of FIG. 2 includes temperature compensation varactor circuitry in the form of varactors 11 and 12. These varactors 11 and 12 are coupled in parallel with the main varactors 9 and 10 of LC tank 2 of the VCO 1. A temperature compensation voltage signal PTAT is applied via input lead 13 to these varactors 11 and 12. The voltage signal PTAT increases with increasing temperature. As temperature increases, the voltage PTAT increases. The increasing PTAT decreases the voltage across the temperature compensation varactors 11 and 12, thereby reducing their capacitances. The decreasing of the capacitances of the temperature compensation varactors 11 and 12 as temperature increases counteracts the affects of how the increasing temperature causes the capacitances of the main varactors 9 and 10 to increase.

As illustrated in FIG. 2, the varactor circuit 6 is AC coupled to inductor 5. The varactor circuit is therefore DC biased via bias resistors 16 and 17. There are noise sources, such as resistor noise introduced by resistors 16 and 17 and such as power supply noise present in voltage VBIAS at voltage supply conductor 18. The power supply noise manifests itself as common mode noise across the varactors. Noise from these sources affects the varactors and increases VCO phase noise in an undesirable way. An improved VCO architecture is desired.

In addition, the VCO 1 may be required to operate over a wide frequency range, for example from 3.0 GHz to 5.0 GHz. To accommodate such a wide frequency range, a capacity to switch in and out the capacitances provided by the switchable capacitor circuits of the coarse tune capacitor bank 7 is required. In some applications, there is a stringent phase noise requirement imposed on the VCO 1 at some operating frequencies. In order to meet this stringent phase noise requirement, the VCO 1 is made to operate with a large AC voltage swing across the LC tank 2 between nodes 19 and 20. The AC voltage swing may be, for example, 2.5 volts peak-to-peak when the VCO 1 is operating at 4.0 GHz. The RF transceiver integrated circuits of which the VCOs are a part of are now often made using thin gate oxide 65 nm or 45 nm MOS semiconductor fabrication processes. Due to the thin gate oxides of the transistors made using such small geometry processes, voltages across the transistors must be maintained below about 1.5 volts in order to prevent the large voltages from causing breakdown and otherwise damaging the transistors. If a simple thin oxide transistor of such a semiconductor process were used for switch 21, then the transistor may break down and fail.

FIG. 3 (Prior Art) is a diagram that illustrates one method of avoiding this problem. A special transistor 22 having a thicker oxide gate dielectric is used. In order to achieve the same performance as is achieved using the thin gate oxide transistor 21 of FIG. 2, however, the thick gate oxide transistor 22 of FIG. 3 is made to be larger. Providing the larger transistor increases parasitics, including parasitic capacitances. It is desired to be able to reduce the overall capacitance of the LC tank 2 when many of the capacitors of switchable capacitor circuits of the coarse tune capacitor bank 7 are switched off so that the VCO 1 can oscillate at a high frequency. The parasitic capacitances of all of the many transistors of the switchable capacitor circuits, however, may combine to be such a large capacitance that the overall LC tank capacitance cannot be reduced as low as required for high frequency VCO 1 operation.

FIG. 4 (Prior Art) is a diagram that illustrates a second method of avoiding the problem with thin gate oxide transistor 21 of FIG. 2 breaking down. In this second method, two thin gate oxide transistors 23 and 24 are provided in series as illustrated. Each of these transistors sees only half of the AC voltage swing between nodes 19 and 20, and therefore can survive the high voltage swing of the VCO 1 without suffering breakdown. To achieve the same performance as with the thin gate oxide transistor 21 of FIG. 2, however, the on resistance through the two transistors should be low. Due to there being two transistors in series rather than one, the sizes of the transistors 23 and 24 are doubled to achieve an adequately low on resistance. This increase in transistor size again increases parasitic capacitances. The parasitic capacitances of all the transistors of all the switchable capacitor circuits of the coarse tune capacitor bank 7 combine such that the lower limit of the capacitance of the LC tank 2 is too high for high frequency VCO 1 operation. Moreover, the series-connected transistors of the topology of FIG. 4 are observed to pick up or otherwise to introduce an increased amount of unwanted noise. The exact mechanism by which this noise is introduced is not fully understood, but an improved VCO architecture is desired.

SUMMARY

In a first aspect, an LC tank of a Voltage-Controlled Oscillator (VCO) includes a main varactor circuit and temperature compensation varactor circuit coupled in parallel with the main varactor circuit. The main varactor circuit is used for fine tuning the VCO. The temperature compensation varactor circuit has a capacitance-voltage characteristic that differs from a capacitance-voltage characteristic of the main varactor circuit such that the effects of common mode noise across the two varactor circuits are minimized. In a first example, the temperature compensation varactor circuit has a capacitance-voltage characteristic of opposite slope to the slope of a capacitance-voltage characteristic of the main varactor circuit. The temperature compensation varactor circuit is made to have the capacitance-voltage characteristic of opposite slope by using P-type varactors rather than N-type varactors as are used in the main varactor circuit. In a second example, the temperature compensation varactor circuit is made to have the capacitance-voltage characteristic of opposite slope by using N-type varactors but by reversing how the varactors are connected in the temperature compensation varactor circuit as compared to how the varactors are connected in the main varactor circuit. The reversing of how the varactors are connected serves to change the sign of the slope of the capacitance-voltage characteristic of the temperature compensation varactor circuit. Minimizing the effects of common mode noise across the two varactor circuits in this way improves VCO phase noise and reduces VCO susceptibility to common mode noise such as power supply noise.

In a second aspect, the LC tank of the VCO also has a plurality of switchable capacitor circuits. These switchable capacitor circuits are used for coarse tuning of the VCO. Each switchable capacitor circuit can be controlled to switch its capacitance into the LC tank, or to switch its capacitance out of the LC tank. By switching capacitances into and out of the LC tank in this way, the VCO is coarse tuned. To prevent breakdown of a main thin oxide switch in each of the switchable capacitor circuits, each switchable capacitor circuit has a capacitive voltage divider circuit coupled around the main thin oxide switch. The capacitive voltage divider circuit serves to reduce the maximum voltage across the main thin oxide switch when the main switch is off. The capacitive voltage divider circuits in the switchable capacitor circuits are enabled for VCO operation in a high voltage mode (a low phase noise mode). The capacitive voltage divider circuits in the switchable capacitor circuits can be disabled for VCO operation in a lower power mode.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 19 is diagram of a conventional coarse tune switchable capacitor circuit.

FIG. 20 is a diagram of the high breakdown voltage coarse tune switchable capacitor circuit in accordance with a second novel aspect.

FIG. 21 is a table that sets forth the maximum voltage across the main transistor in a conventional switchable capacitor circuit and in the high breakdown switchable capacitor circuit of FIG. 20.

FIG. 23 is a table that illustrates operation of the switchable capacitor circuit of FIG. 20.

DETAILED DESCRIPTION

Figure 5:
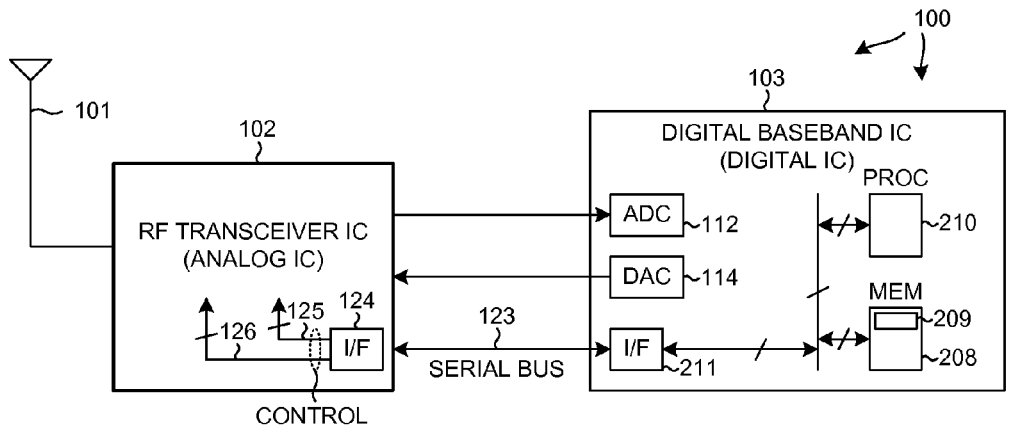
FIG. 5 is a simplified high level block diagram of a mobile communication device 100 in accordance with one novel aspect.

FIG. 5 is a simplified high level block diagram of a mobile communication device 100 in accordance with a first novel aspect. In this example, mobile communication device 100 is a cellular telephone. The cellular telephone 100 includes (among several other components not illustrated) an antenna 101 and two integrated circuits 102 and 103. Integrated circuit 103 is called a "digital baseband integrated circuit." Integrated circuit 102 is a Radio Frequency (RF) transceiver integrated circuit. RF transceiver integrated circuit 102 is called a "transceiver" because it includes a transmitter as well as a receiver.

Figure 1:
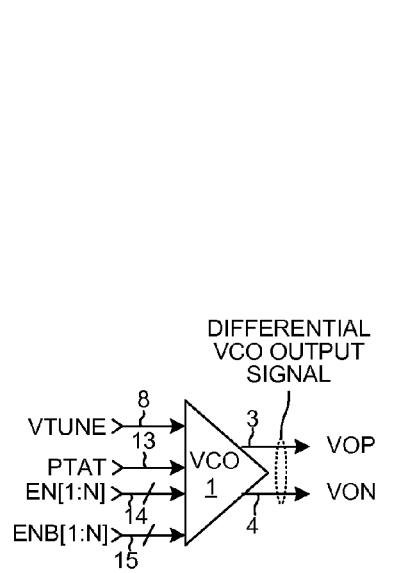
FIG. 1 (Prior Art) is a symbol of a Voltage Controlled Oscillator (VCO) 1.
Figure 6:
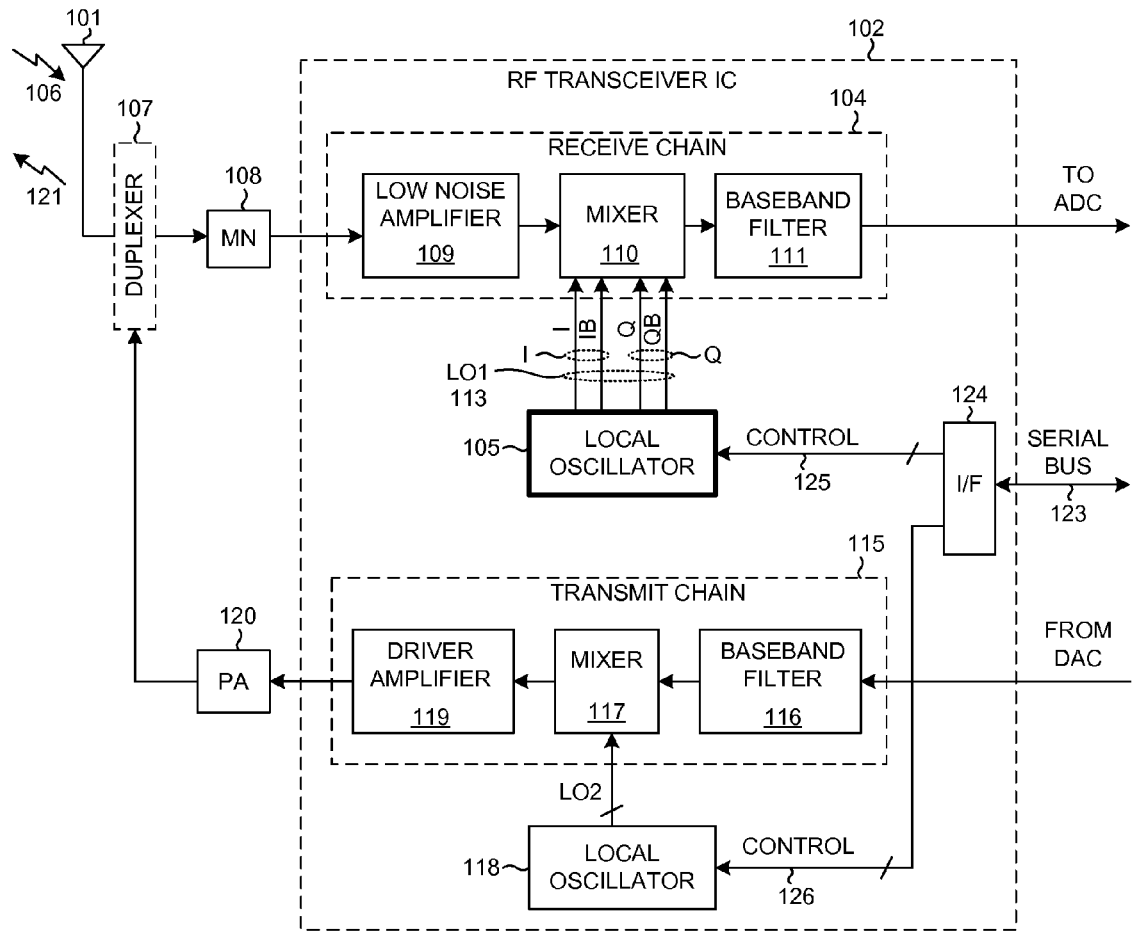
FIG. 6 is a more detailed block diagram of the RF transceiver integrated circuit of FIG. 5.

FIG. 6 is a more detailed block diagram of the RF transceiver integrated circuit 102 of FIG. 5. The receiver includes what is called a "receive chain" 104 as well as a local oscillator 105. When the cellular telephone is receiving, a high frequency RF signal 106 is received on antenna 101. Information from signal 106 passes through duplexer 107, matching network 108, and through the receive chain 104. Signal 106 is amplified by Low Noise Amplifier (LNA) 109 and is down-converted in frequency by mixer 110. The resulting down-converted signal is filtered by baseband filter 111 and is passed to the digital baseband integrated circuit 103 of FIG. 1. An analog-to-digital converter 112 in the digital baseband integrated circuit 103 converts the signal into digital form and the resulting digital information is processed by digital circuitry in the digital baseband integrated circuit 103. The digital baseband integrated circuit 103 tunes the receiver by controlling the frequency of an LO signal (LO1) 113.

If the cellular telephone is transmitting, then information to be transmitted is converted into analog form by a Digital-to-Analog Converter (DAC) 114 in the digital baseband integrated circuit 103 and is supplied to a "transmit chain" 115 in the RF transceiver integrated circuit 102. Baseband filter 116 then filters out noise due to the digital-to-analog conversion process. Mixer block 117 under control of local oscillator 118 then up-converts the signal into a high frequency signal. Driver amplifier 119 and an external Power Amplifier (PA) 120 amplify the high frequency signal to drive antenna 101 so that a high frequency RF signal 121 is transmitted from antenna 101. The digital baseband integrated circuit 103 controls the transmitter by controlling the frequency of an LO signal (LO2) supplied to mixer 117. Digital baseband integrated circuit 103 controls the local oscillators 105 and 118 by sending appropriate control information across a digital serial bus 123, through bus interface 124, and control lines 125 and 126.

Figure 7:
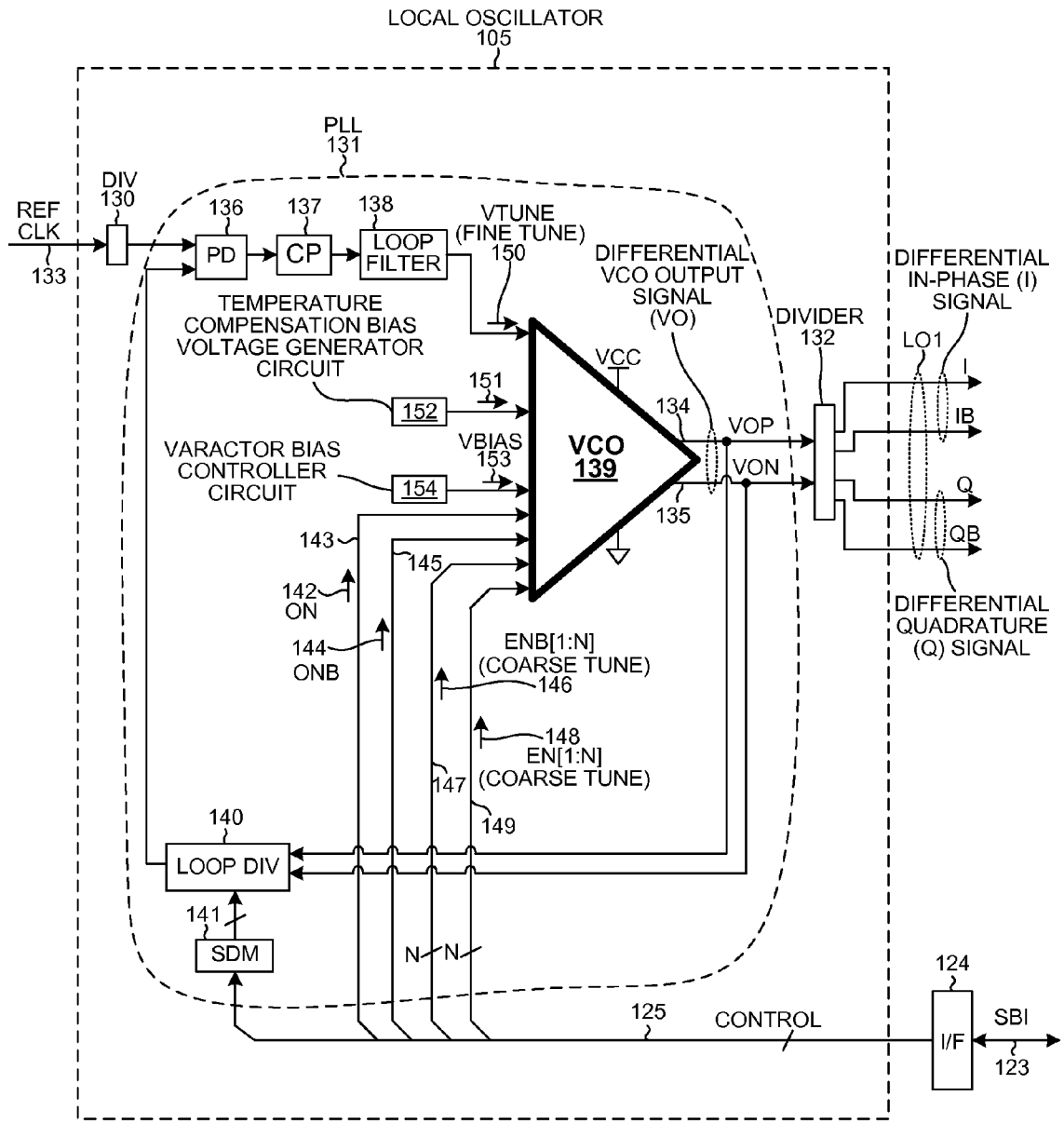
FIG. 7 is a more detailed block diagram of the local oscillator of FIG. 6.

FIG. 7 is a more detailed block diagram of the local oscillator 105 of FIG. 6. The local oscillator 105 includes a novel Voltage-Controlled Oscillator (VCO) 139. Local oscillator 105 includes a divider 130, a Phase-Locked Loop (PLL) 131 and a divider circuit 132. PLL 131 receives an externally generated reference signal REF CLK on conductor 133 (for example, a 19.2 MHz signal generated by an external crystal oscillator) and generates therefrom a differential PLL output signal VO. The label "VO" used here indicates that the VO signal is the differential VCO output signal. The signal VO includes a signal VOP on conductor 134 and a signal VON on conductor 135. The PLL 131 in this case includes a phase comparator 136, a charge pump 137, a loop filter 138, the novel VCO 139, a loop divider 140, and a Sigma-Delta Modulator 141. The differential VCO output signal is divided down in frequency by divider 132 to generate the local oscillator signal LO1. Local oscillator signal LO1 includes a differential In-phase (I) signal and a differential Quadrature (Q) signal. The local oscillator 105 is controlled by a multi-bit digital control value CONTROL on digital input signal conductors 125. The multi-bit digital control value CONTROL includes a digital control value ON 142 on conductor 143 and its complement ONB 144 on conductor 145. The multi-bit control value CONTROL also includes the multi-bit digital control value ENB[1:N] 146 on conductors 147 and the complements of those signals EN[1:N] 148 on conductors 149. VCO 139 receives a fine tune analog control signal VTUNE 150 from loop filter 138. VCO 139 receives a temperature compensation control signal 151 from a temperature compensation bias voltage generator circuit 152. VCO 139 also receives a varactor bias supply voltage VBIAS 153 from a VBIAS supply voltage controller circuit 154.

Figure 8:
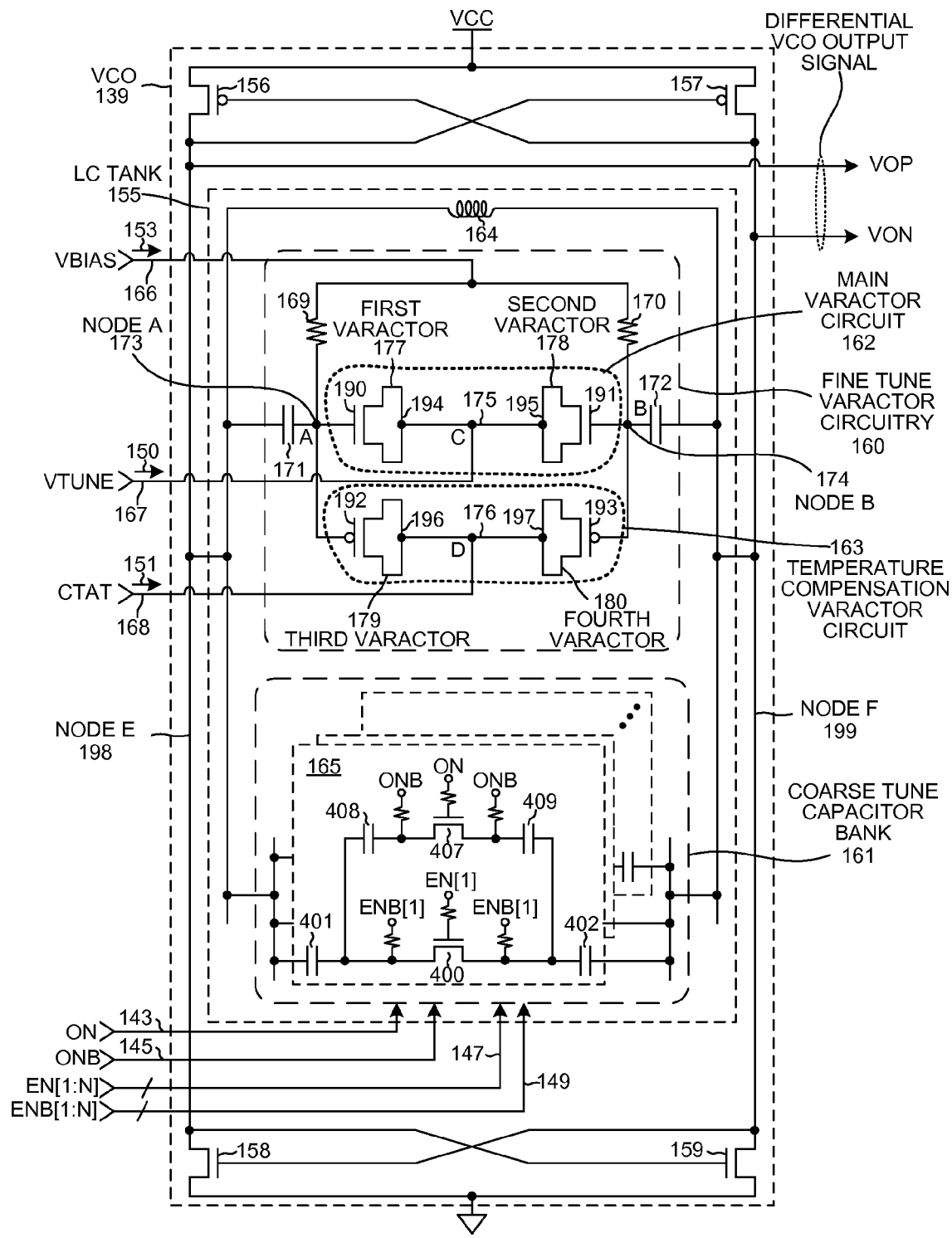
FIG. 8 is a circuit diagram of the VCO of the local oscillator of FIG. 7 in accordance with a first example of a first novel aspect.

FIG. 8 is a circuit diagram of VCO 139 of FIG. 7 in accordance with a first example of a first novel aspect. VCO 139 includes an LC tank 155 and amplifier circuitry 156-159. LC tank 155 includes an inductor 164, fine tune varactor circuitry 160 and coarse tune capacitor bank 161. Fine tune varactor circuitry 160 includes a pair of 1 k ohm bias resistors 169 and 170, a main varactor circuit 162, a temperature compensation varactor circuit 163, and a pair of coupling capacitors 171 and 172. Coarse tune capacitor bank 161 is a digitally programmable capacitor structure that includes a plurality of parallel-connected switchable capacitor circuits. A representative one of the switchable capacitor circuits is identified in FIG. 8 with reference numeral 165. The VBIAS supply voltage signal 153 is received by the VCO via supply conductor and bias node 166. Fine tune control voltage VTUNE signal 150 is received by the VCO via tuning voltage input conductor 167. The temperature compensation voltage in this case is a Complementary To Absolute Temperature (CTAT) voltage signal 151 received by the VCO via temperature compensation voltage input conductor 168. Accordingly, as temperature increases the voltage CTAT decreases and as temperature decreases the voltage CTAT increases. Within the fine tune varactor circuitry 160, the main varactor circuit 162 is coupled between node A 173 and node B 174 in parallel with the temperature compensation varactor circuit 163 as illustrated. The fine tune VTUNE signal 150 is received onto node C 175 within the main varactor circuit 162. The temperature compensation control signal 151 is received onto node D 176 within the temperature compensation varactor circuit 163. The first varactor 177 and the second varactor 178 of the main varactor circuit 162 have N-type channel regions. A third varactor 179 and a fourth varactor 180 of the temperature compensation varactor circuit 163 have P-type channel regions.

The varactors 177-180 are MOS field effect varactors having insulated gate terminals. The term channel region is used in a general sense and does not indicate that a conductive channel must be formed between a source region and a drain region as in a transistor, but rather the term channel region refers to the semiconductor material underneath the gate in which a depletion region can form to provide a separation of charge and thereby change the capacitance of the varactor structure. The varactors 177-180 in the illustrated example include source and drain regions but varactors of other types can be employed. In the illustrated example, the N-type varactors 177 and 178 are N-channel transistor structures that involve source and drain regions that are relatively heavily N-type doped regions (N+) whereas the intervening channel region is a relatively lightly N-type doped region (N−). Similarly, the P-type varactors 179 and 180 are P-type transistor structure that involve source and drain regions that are relatively heavily P-type doped regions (P+) whereas the intervening channel region is a relatively lightly P-type doped region (P−). In each varactor, the source, drain, and bulk regions are shorted together. The gate terminals of the varactors are indicated by reference numerals 190-193. The common source-drain terminals of the varactors are indicated by reference numerals 194-197.

Figure 9:
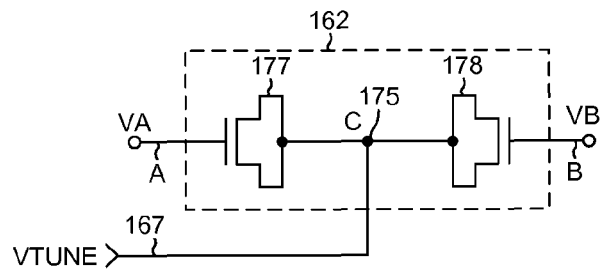
FIG. 9 is a diagram that shows the main varactor circuit of the VCO of FIG. 8 in further detail.

FIG. 9 is a diagram that shows the main varactor circuit 162 in further detail.

Figure 10:
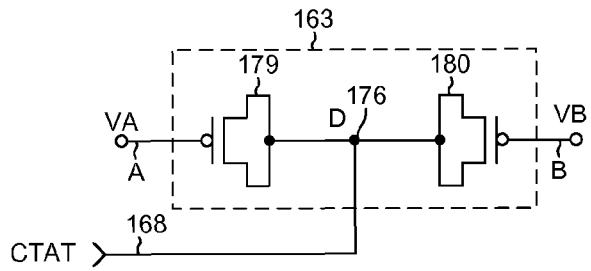
FIG. 10 is a diagram that shows the temperature compensation varactor circuit of the VCO of FIG. 8 in further detail.

FIG. 10 is a diagram that shows the temperature compensation varactor circuit 163 in further detail.

Figure 11:
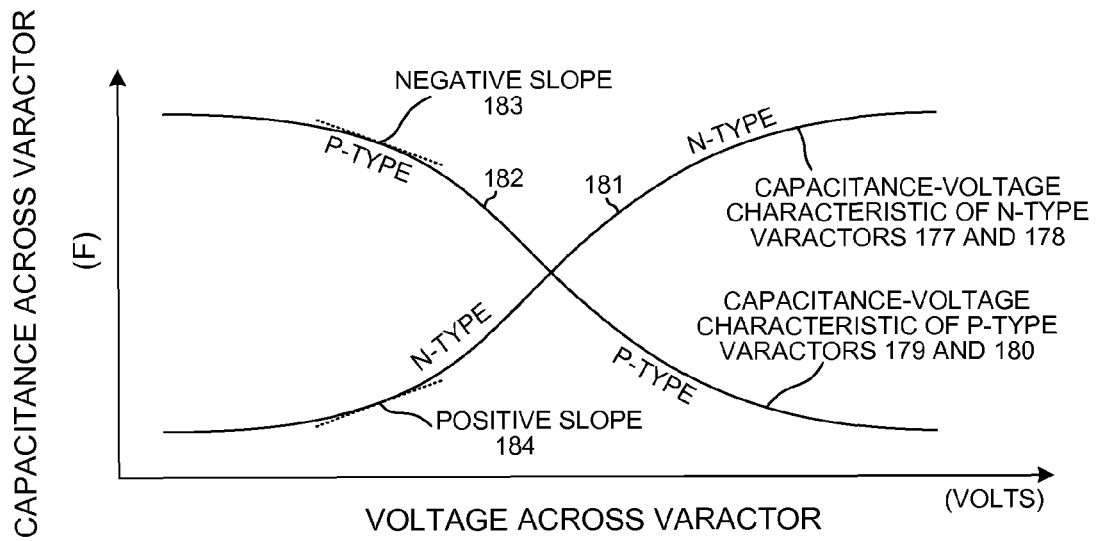
FIG. 11 is a diagram that shows the capacitance-voltage characteristics of the varactors in the main varactor circuit and in the temperature compensation varactor circuit.

FIG. 11 is a diagram that shows the capacitance-voltage characteristics of the varactors 177-180. Line 181 represents the capacitance-voltage characteristic of the varactors 177 and 178 of the main varactor circuit 162. These varactors 177 and 178 have N-type channel regions. The voltage of the X-axis for line 181 is the voltage between node A and node C. Line 182 represents the capacitance-voltage characteristic of varactors 179 and 180 of the temperature compensation varactor circuit 163. These varactors 179 and 180 have P-type channel regions. The voltage of the X-axis for line 182 is the voltage between node A and node D. The slope of 183 of how varactor capacitance changes with respect to voltage for the P-type varactors 179 and 180 is of opposite sign to the slope 184 of how varactor capacitance changes with respect to voltage for the N-type varactors 177 and 178.

Figure 12:
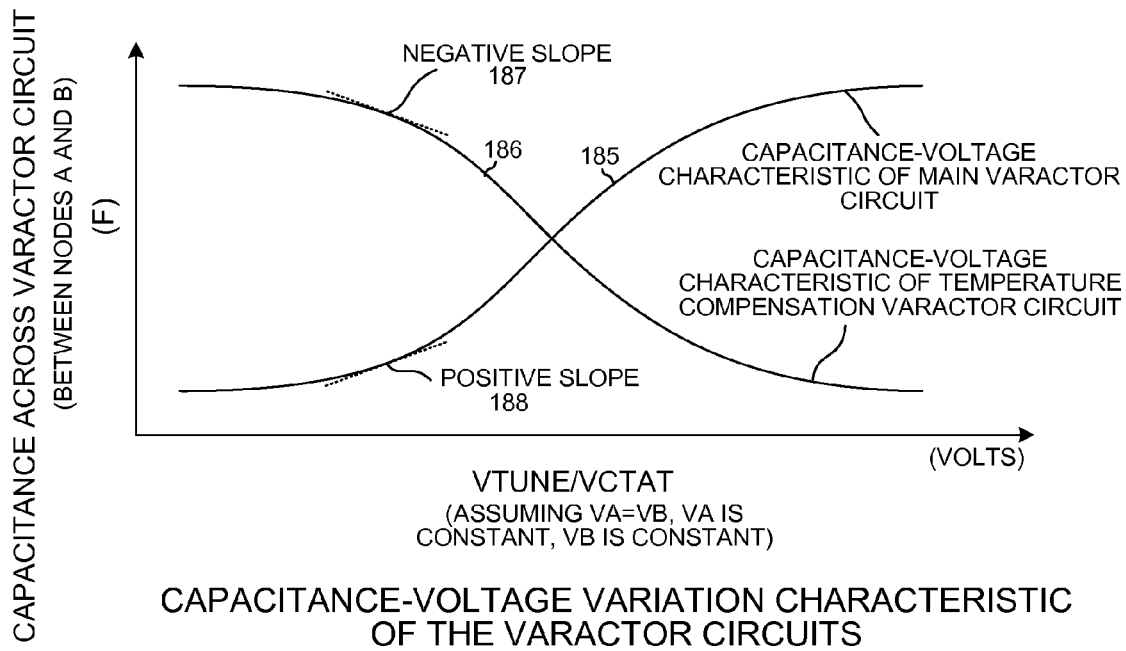
FIG. 12 is a diagram that shows the capacitance-voltage characteristics of the overall main varactor circuit and of the overall temperature compensation varactor circuit.

FIG. 12 is a diagram that shows the capacitance-voltage characteristics of the main varactor circuit 162 and the capacitance-voltage characteristic of the temperature compensation varactor circuit 163. Line 185 represents the capacitance-voltage characteristic of main varactor circuit 162. The capacitance of this capacitance-voltage characteristic is the capacitance between node A and node C. The voltage of this capacitance-voltage characteristic is the common mode voltage across the varactor circuit, namely the voltage difference between node A and the VTUNE voltage node C 175, where the voltages on nodes A and B are identical. Line 186 represents the capacitance-voltage characteristic of temperature compensation varactor circuit 163. The capacitance of this capacitance-voltage characteristic is the capacitance between node A and node D. The voltage of this capacitance-voltage characteristic is the common mode voltage across the varactor circuit, namely the voltage difference between node A and the CTAT voltage node D 176, where the voltages on nodes A and B are identical. For the same common mode voltage across the two varactor circuits, the two varactor circuits exhibit capacitance-voltage characteristics of different slopes. The slope 188 of the main varactor circuit 162 is positive, whereas the slope 187 of the temperature compensation varactor circuit 163 is negative. The main varactor circuit 162 and the temperature compensation varactor circuit 163 may at a given time be operating at different common mode voltages, but the two different varactor circuits change their capacitances in substantially opposite ways for a given change in common mode voltage. The slopes of the capacitance-voltage characteristics of the two varactor circuits are of opposite signs.

Figure 2:
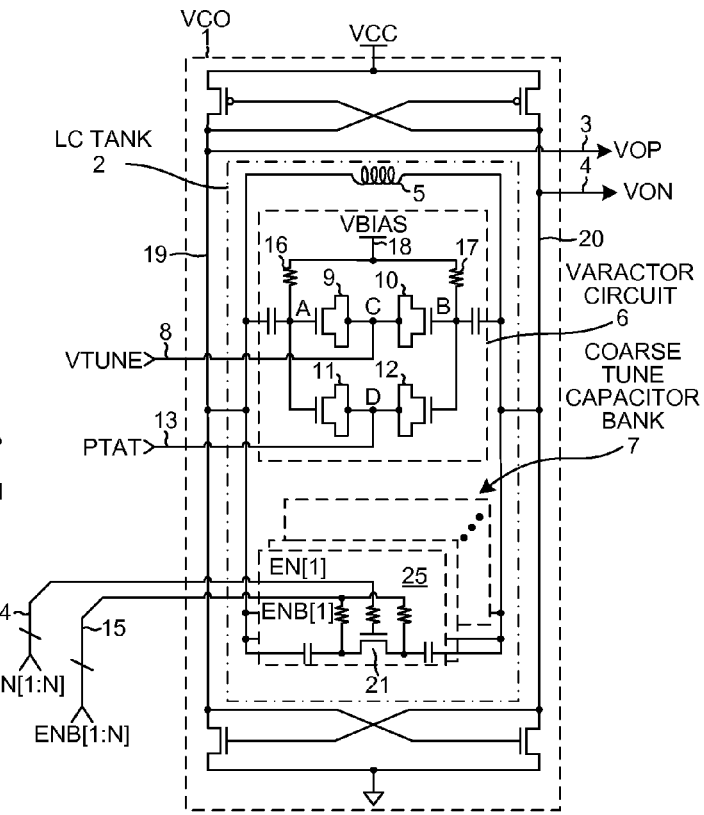
FIG. 2 (Prior Art) is a more detailed diagram of the VCO 1 of FIG. 1.
Figure 3:
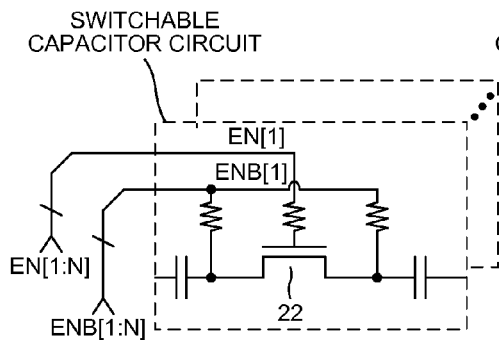
FIG. 3 (Prior Art) is a diagram of a coarse tune switch circuit involving a thick oxide transistor.
Figure 13:
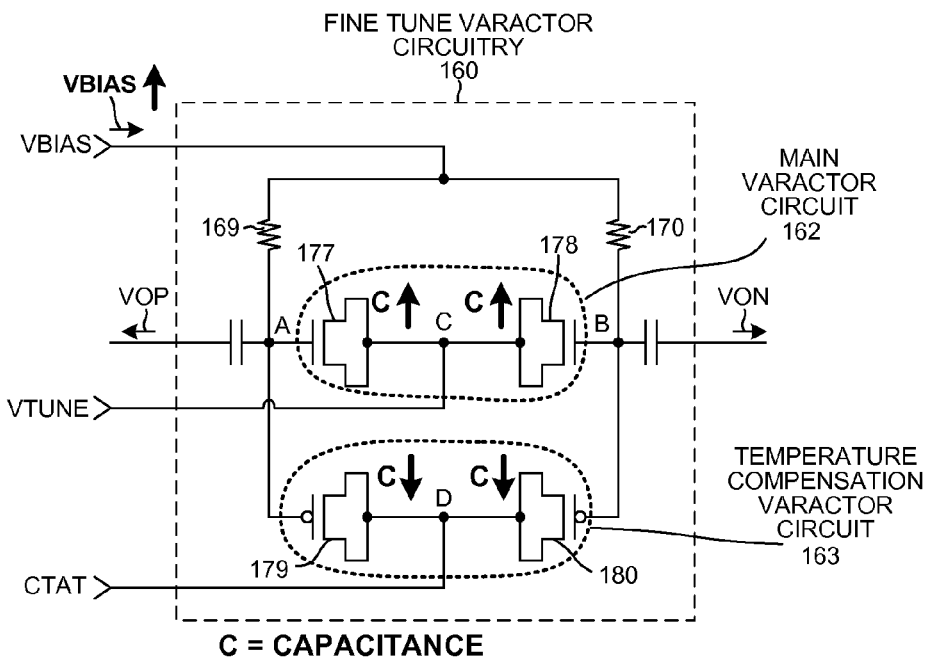
FIG. 13 is a diagram that illustrates how the fine tune varactor circuitry of FIG. 8 has less susceptibility to common mode noise on nodes A and B as compared to conventional fine tune varactor circuitry.

FIG. 13 is a diagram that illustrates how the fine tune varactor circuitry 160 of FIG. 8 has less susceptibility to common mode noise on nodes A and B as compared to the conventional fine tune varactor circuitry 6 of FIG. 2. If, for example, the voltage of VBIAS were to increase (assuming VTUNE and CTAT were to remain constant) due to power supply noise, then the voltage on nodes A and B would increase. This is referred to as common mode noise because it is common to both nodes A and B. The increase in the voltage on nodes A and B would result in an increase in the capacitance across nodes A and B due to the capacitance-voltage characteristic of the main varactor circuit 162 having a positive slope. In the novel circuit of FIG. 8, however, the increase in the voltage on nodes A and B would also cause a decrease in the capacitance across nodes A and B provided by the temperature compensation varactor circuit 163. The effect of the temperature compensation varactor circuit 163 on the capacitance across nodes A and B due to common mode noise may either fully compensate for, or partially compensate for, the effects of the main varactor circuit 162 on the capacitance across nodes A and B due to common mode noise.

Figure 14:
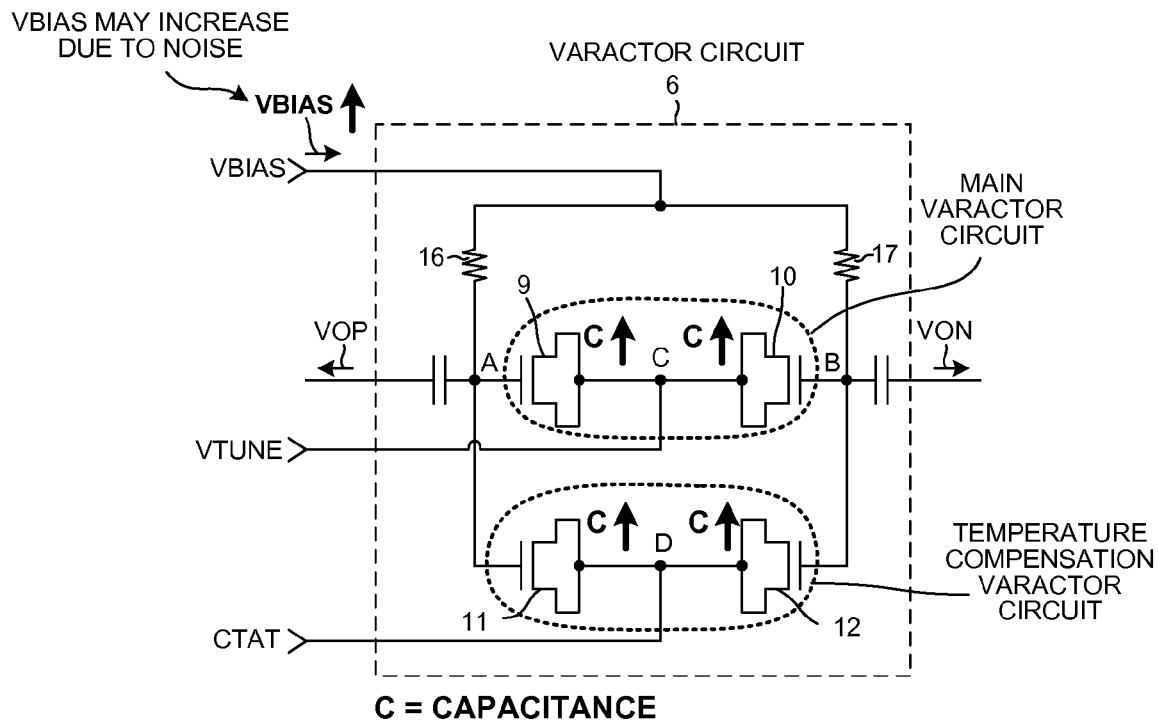
FIG. 14 is a diagram that shows how the varactor circuit of the prior art is susceptible to common mode noise on nodes A and B.

FIG. 14 is a diagram that shows how the varactor circuit 6 of the prior art of FIG. 2 has more susceptibility to common mode noise on nodes A and B. An increase in VBIAS would cause the common mode voltage across the varactors of both the main varactor circuit and the temperature compensation varactor circuit to increase. Because the slopes of the capacitance-voltage characteristics of both the main varactor circuit and the temperature compensation varactor circuit are of the same sign, the increase in capacitance between nodes A and B due to the main varactor circuit is not countered by the temperature compensation varactor circuit, but rather the increase is further exacerbated because the capacitances of the varactors of the temperature compensation varactor circuit also increase.

Figure 15:
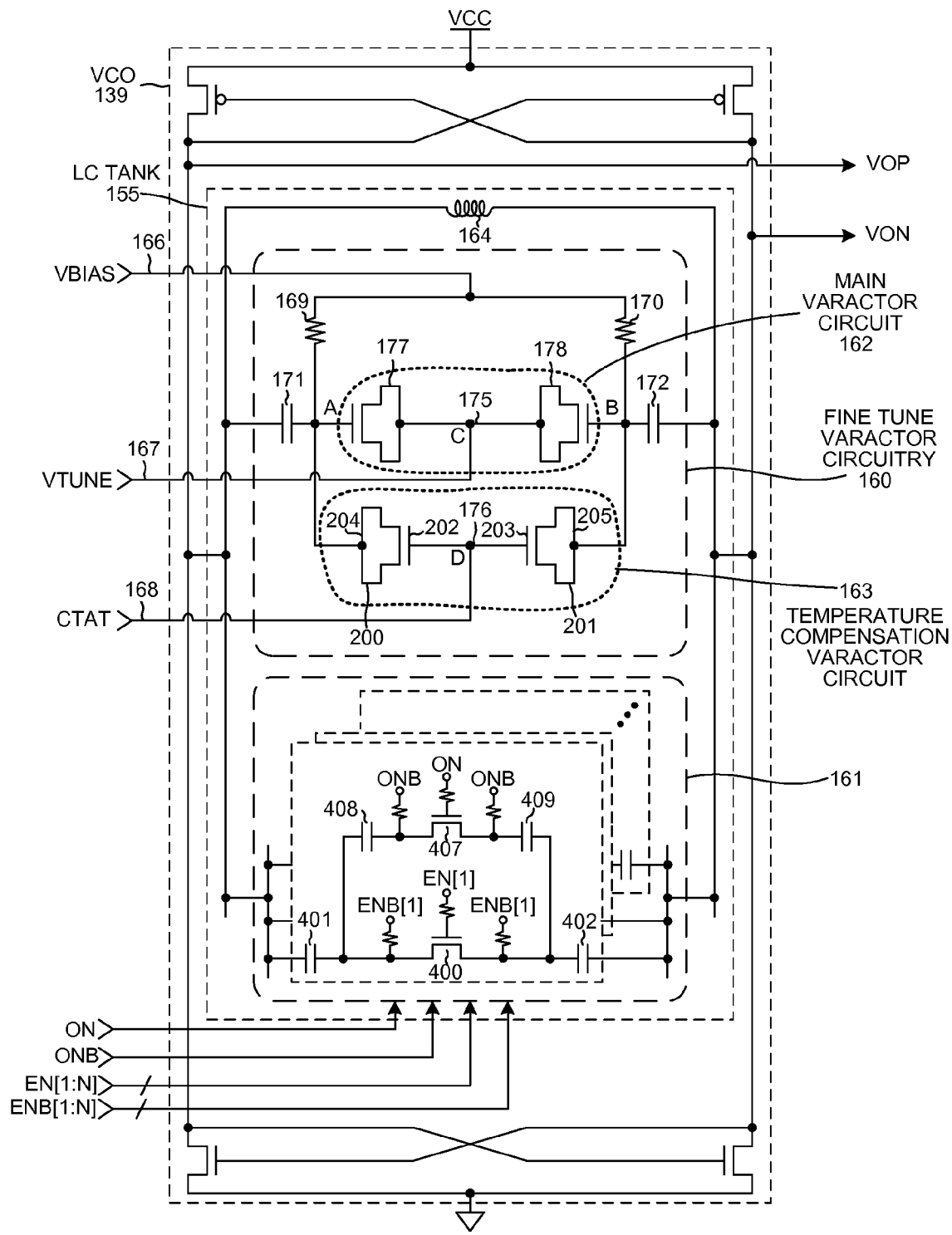
FIG. 15 is a circuit diagram of the VCO in the local oscillator of FIG. 7 in accordance with a second example of the first novel aspect.

FIG. 15 is a diagram of the fine tune varactor circuitry 160 of VCO 139 in accordance with a second example of the first novel aspect. Rather than countering the effects of common mode noise voltage on the main varactor circuit 162 by providing P-type varactors in the temperature compensation varactor circuit 163, N-type varactors 200 and 201 are provided but the connections of the N-type varactors 200 and 201 of the temperature compensation varactor circuit 163 are reversed so that they are connected as illustrated in FIG. 15. Varactors are two terminal devices. Reversing the connections to the varactors therefore results in a reversing of the capacitance-voltage characteristic. This effect can be thought of as mirroring the capacitance-voltage characteristic about an axis in the y dimension. The slope of the capacitance-voltage characteristic of the varactor therefore changes in sign. The diagrams of FIG. 11 and FIG. 12 are therefore also descriptive of the second example of FIG. 15. Note that in FIG. 15 that the varactors 200 and 201 have N-type channel regions that are the same as the N-type channel regions of varactors 177 and 178, but that the varactors 200 and 201 have their gate terminals 202 and 203 connected together at node D 176. The common source-drain terminal 204 of varactor 200 is coupled to the gate terminal of varactor 177 at node A. The common source-drain terminal 205 of varactor 201 is coupled to the gate terminal of varactor 178 at node B.

Figure 4:
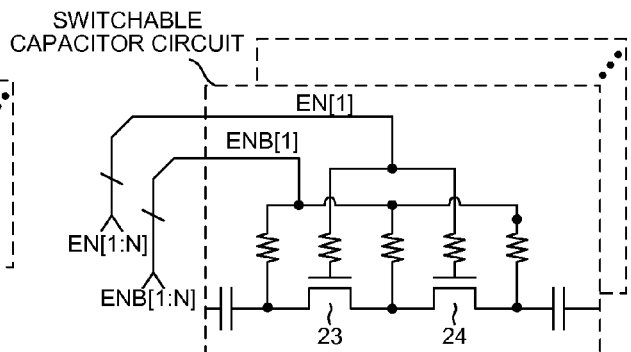
FIG. 4 (Prior Art) is a diagram of a coarse tune switch circuit involving two series-connected thin oxide transistors.
Figures 16, 17:
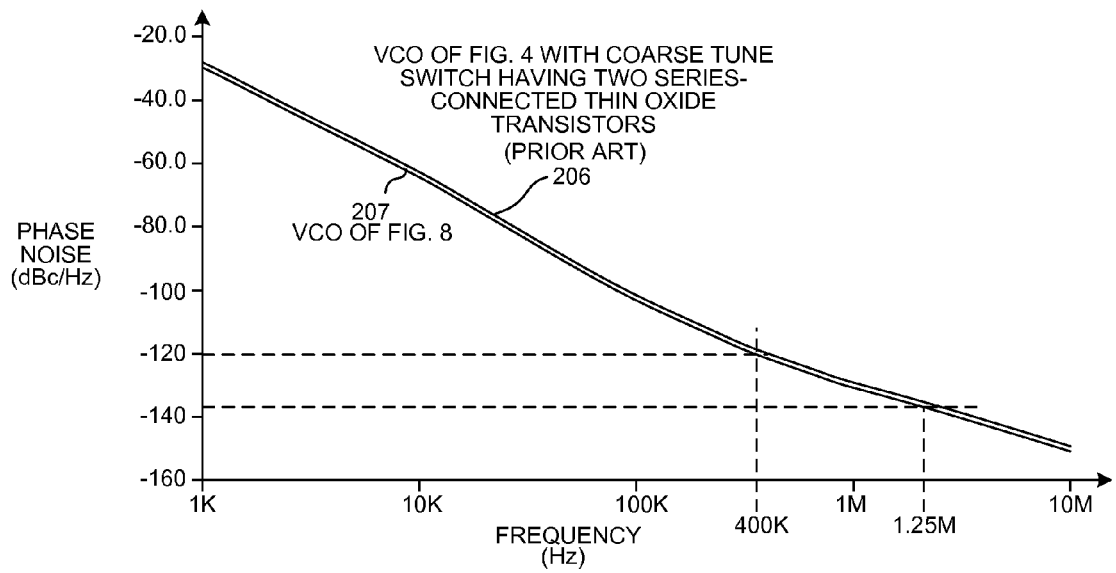
FIG. 16 is a table that shows a comparison of VCO phase noise for the double thin oxide transistor prior art VCO and for the VCO of FIG. 8.
FIG. 17 is a plot that shows a comparison of VCO phase noise for the double thin oxide transistor prior art VCO and for the VCO of FIG. 8.

FIG. 16 is a table that shows a comparison of VCO phase noise for the double thin oxide transistor prior art VCO of FIG. 4 and the VCO 139 of FIG. 8. "TT/55" indicates a typical process corner at fifty-five degrees Celsius. "SS/110" indicates a slow process corner at one hundred ten degrees Celsius.

FIG. 17 is a plot that shows a comparison of VCO phase noise for the double thin oxide transistor prior art VCO of FIG. 4 and the VCO 139 of FIG. 8. Line 206 represents the VCO phase noise of the conventional VCO of FIG. 4. Line 207 represents the VCO phase noise of the VCO 139 of FIG. 8. For operating frequencies anywhere in the range from about 1 kHz to about 10 MHz, the VCO 139 of FIG. 8 exhibits a phase noise improvement of about 1 dB as compared to the prior art VCO.

Figure 18:
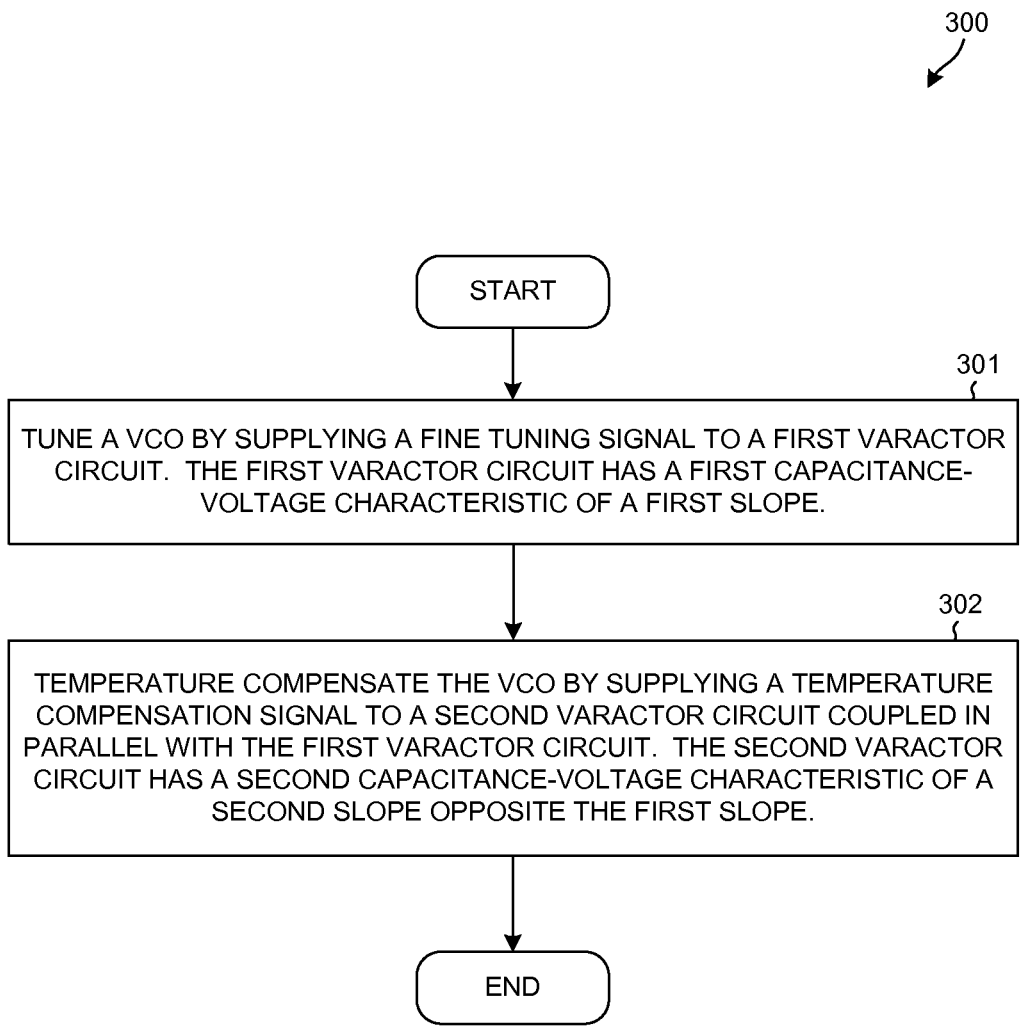
FIG. 18 is a flowchart of a method of temperature compensating a main varactor circuit.

FIG. 18 is a flowchart of a method 300 of temperature compensating a main varactor circuit. A VCO is tuned (step 301) by supplying a fine tuning signal to a first varactor circuit. The first varactor circuit has a first capacitance-voltage characteristic of a first slope. In one example, the first varactor circuit is the main varactor circuit 162 of FIG. 8. In another example, the first varactor circuit is the main varactor circuit 162 of FIG. 15. The VCO is temperature compensated (step 302) by supplying a temperature compensation signal to a second varactor circuit. The second varactor circuit is coupled in parallel with the first varactor circuit. The second varactor circuit has a second capacitance-voltage characteristic of a second slope opposite the first slope. In one example, the second varactor circuit is the temperature compensation varactor circuit 163 of FIG. 8. In another example, the second varactor circuit is the temperature compensation varactor circuit 163 of FIG. 15.

FIG. 19 is diagram of a conventional coarse tune switchable capacitor circuit. As the VCO oscillates, there may be a large 3.0 volt AC peak-to-peak voltage swing between node 19 and node 20. There is a voltage drop across capacitor 26 due to leakage through the transistor 21 and to parasitics at node 27 and to other effects. Similarly, there is a voltage drop across capacitor 28 due to leakage through the transistor 21 and to parasitics at node 29 and to other effects. Nonetheless, the transistor 21 in the conventional circuit may experience an AC peak-to-peak source-to-drain voltage as high as 2.6 volts.

FIG. 20 is a diagram of the high breakdown voltage coarse tune switchable capacitor circuit 165 of VCO 139 of FIG. 8 in accordance with a second novel aspect. A first lead of a first capacitor 401 is coupled to a source of a first transistor 400. A second lead of first capacitor 401 is coupled to node E 198. A first lead of a second capacitor 402 is coupled to a drain of the first transistor 400. A second lead of second capacitor 402 is coupled to node F 199. The terms source and drain are used interchangeably here.

In addition to the first transistor 400, the first capacitor 401, the second capacitor 402, and resistors 403-405, a circuit 406 for providing a voltage dividing capacitance across transistor 400 is provided. The capacitive voltage divider circuit 406 includes a second transistor 407, a third capacitor 408, a fourth capacitor 409, and three resistors 410-412 interconnected as illustrated in FIG. 20. A first lead of the third capacitor 408 is coupled to the source of the second transistor 407. A second lead of the third capacitor 408 is coupled to a source of the first transistor 400. Similarly, a first lead of the fourth capacitor 409 is coupled to the drain of the second transistor 407. A second lead of the fourth capacitor 409 is coupled to a drain of the first transistor 400.

First transistor 400 and second transistor 407 are thin oxide transistors. If transistor 407 is on and conductive, then a capacitance (the equivalent capacitance of the series-connected capacitors 408 and 409) is coupled across nodes 413 and 414. Consider a situation in which main switch transistor 400 is off, in which +1.5 volts is present on node E 198, and −1.5 volts is present on node F 199. This is the condition when the maximum voltage is present between nodes 198 and 199 when the VCO is oscillating. A capacitive voltage divider is formed by capacitor 401, the capacitance of circuit 406, and capacitor 402. This capacitive voltage divider reduces the voltage between nodes 413 and 414 to be about 2.0 volts as illustrated, as compared to the higher 2.6 volts present across transistor 21 in the conventional circuit of FIG. 19. To switch the capacitance of capacitors 401 and 402 out of the LC tank, the transistor 400 is turned off by setting digital signal EN[1] to a digital logic low and by setting digital signal ENB[1] to a digital logic high. EN[1] is received on conductor 415 (one of the N conductors 149 of FIG. 7). ENB[1] is received on conductor 416 (one of the N conductors 147 of FIG. 7). Digital signal ON is set to a digital logic high and digital signal ONB is set to a digital logic low to enable the circuit 406. If, on the other hand, the capacitance of capacitors 401 and 402 are to be switched into the LC tank, then transistor 400 is turned on by setting EN[1] high and ENB[1] low.

The VCO 139 may have a first mode (a low phase noise mode) in which the AC peak-to-peak voltage swing between nodes 198 and 199 is high (for example, 3.0 volts) and may have a second mode (a low power mode) in which the AC peak-to-peak voltage swing between nodes 198 and 199 is not as high (for example, 2.0 volts). In the second mode, the signals ON and ONB are low and high respectively to disable the circuit 406. There are multiple switchable capacitor circuits of substantially identical construction coupled together in parallel to form the coarse tune bank 161. The circuit 406 in all these switchable capacitor circuits are controlled together by the digital signals ON and ONB. The main transistors of the switchable capacitor circuits, however, are independently controlled. The main transistor of each switchable capacitor circuit is supplied with its own enable signals EN and ENB. The signals EN[1:N] and ENB[1:N] in FIG. 8 represent N sets of these enable control signals for independently controlling the N switchable capacitor circuits of the coarse tune capacitor bank 161.

FIG. 21 is a table that sets forth the maximum voltage across the main transistor in the conventional switchable capacitor circuit of FIG. 2 and in the high breakdown switchable capacitor circuit of FIG. 20. The values in the table are for a 3.0 volt AC peak-to-peak voltage between node E 198 and node F 199.

Figure 22:
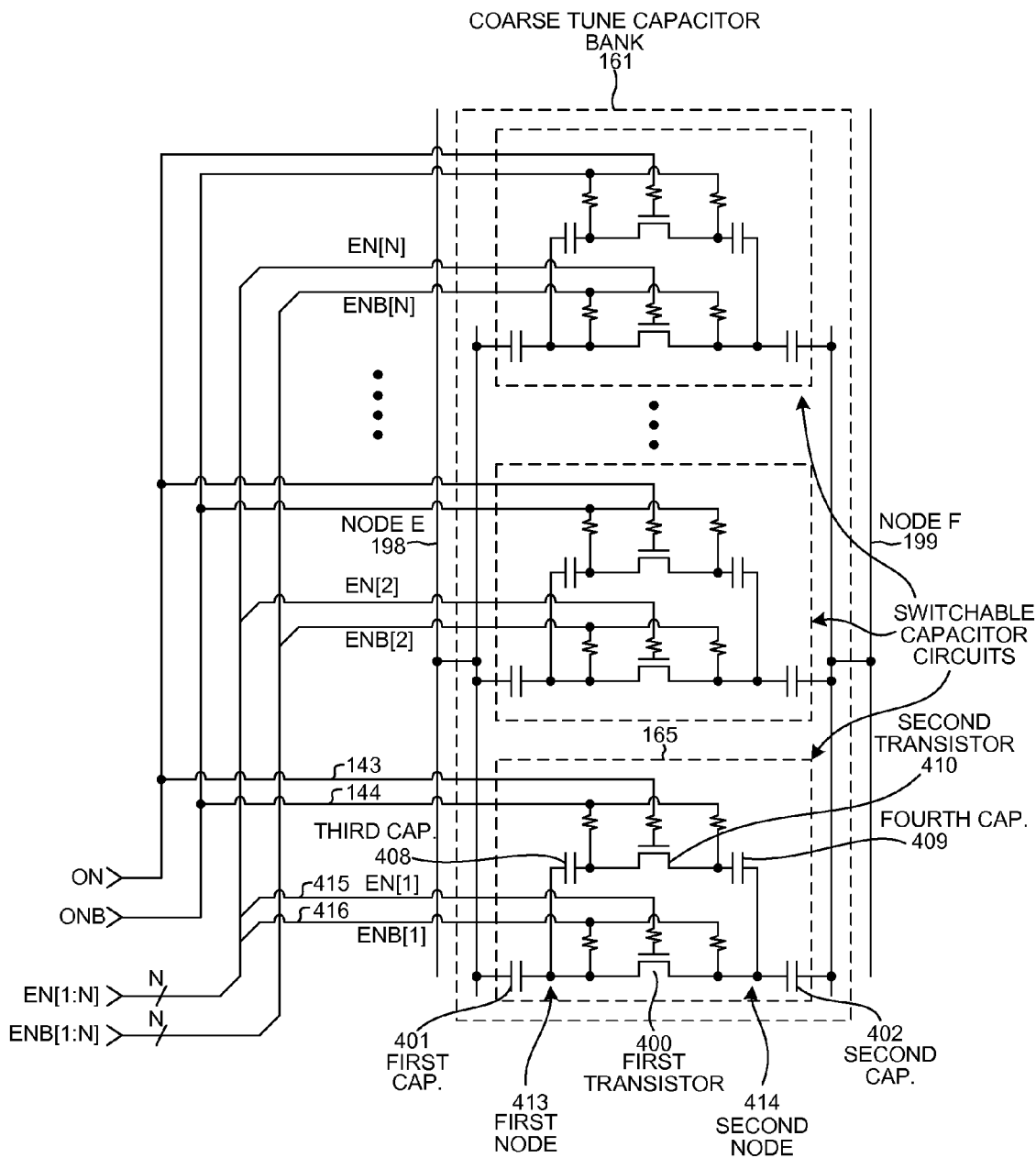
FIG. 22 is a more detailed diagram of the coarse tune capacitor bank in the VCO of FIG. 8.

FIG. 22 is a more detailed diagram of the coarse tune capacitor bank 161. The capacitance values of the first and second capacitors of the various switchable capacitor circuits are typically binary weighted. The first switchable capacitor circuit has capacitors of 1 pF, the second switchable capacitor circuit has capacitors of 2 pF, the third switchable capacitor circuit has capacitors of 4 pF, and so on.

FIG. 23 is a table that illustrates operation of the switchable capacitor circuit 165 of FIG. 20. Circuit 406 is enabled in the first mode (the high voltage mode or the low phase noise mode). Circuit 406 is disabled in the second mode (the low voltage mode or the low power mode). The switchable capacitor circuit 165 is controllable to switch in or to switch out its capacitance into or out of the LC tank. In the first mode, when the capacitance is switched out of the LC tank the switchable capacitor circuit 165 adds 0.1 pF between nodes 198 and 199, whereas when the capacitance is switched in the switchable capacitor circuit 165 adds 0.5 pF between nodes 198 and 199. In the second mode, when the capacitance is switched out the switchable capacitor circuit 165 adds 0.02 pF between nodes 198 and 199, whereas when the capacitance is switched in the switchable capacitor circuit 165 adds 0.5 pF between nodes 198 and 199. Although the equations provided in the table assume ideal capacitors are being used, in an actual circuit there are many parasitics from the various nodes to other various nodes and these parasitics are substantial. Consequently the voltages are best determined by building an actual circuit and testing it, or simulating it using a circuit simulator such as SPICE.

Figure 24:
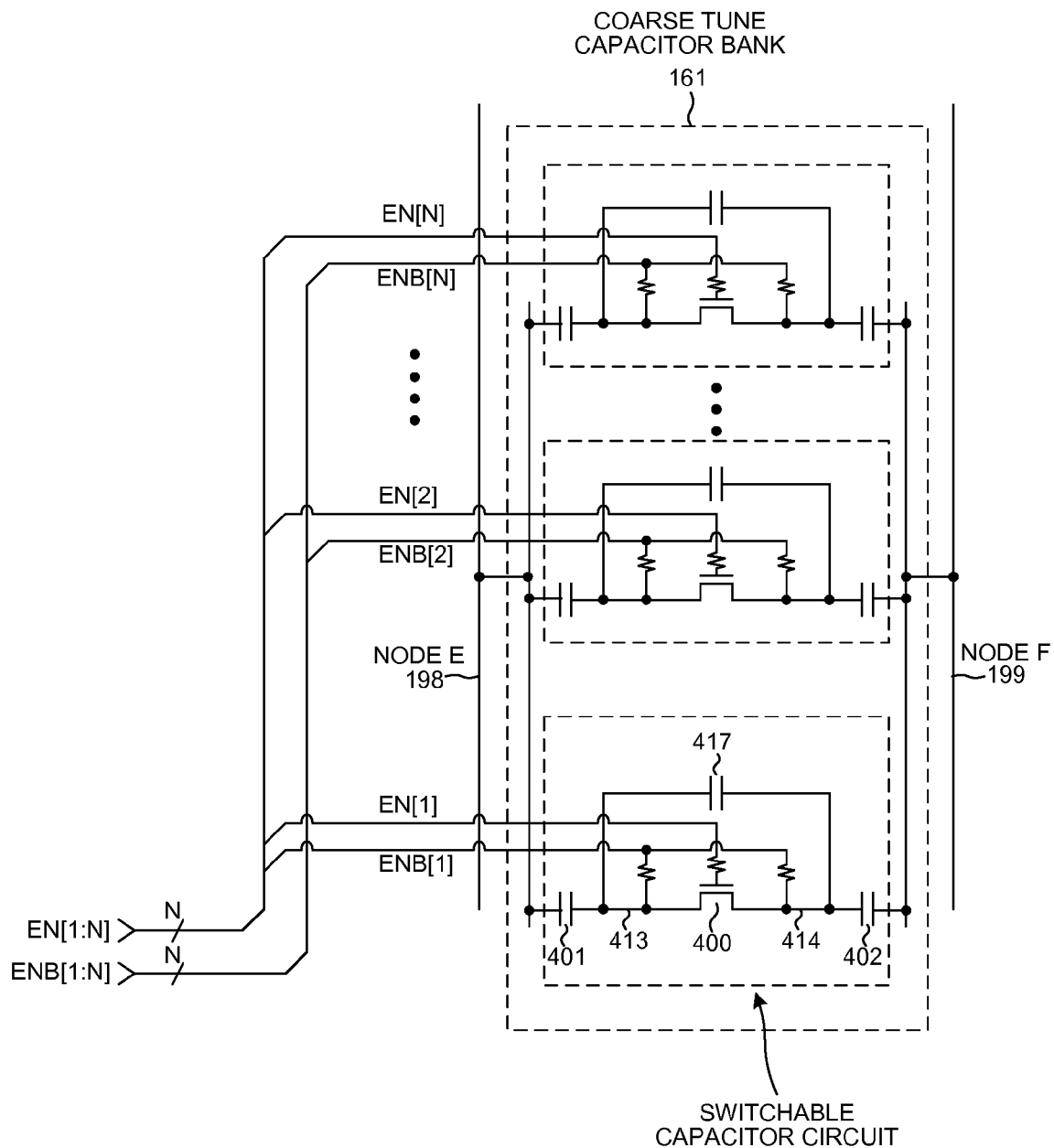
FIG. 24 is a diagram of a coarse tune capacitor bank in which the capacitive voltage dividing circuits are always enabled.

FIG. 24 is a diagram of the coarse tune capacitor bank 161 in which the capacitive voltage dividing circuits (for example, circuit 406) are always enabled. In the example of FIG. 24, no transistor is provided in circuit 406, rather just one capacitor 417 is provided as shown. This capacitor 417 is permanently coupled between the source of the main transistor at node 413 and the drain of the main transistor 400 at node 414.

Figure 25:
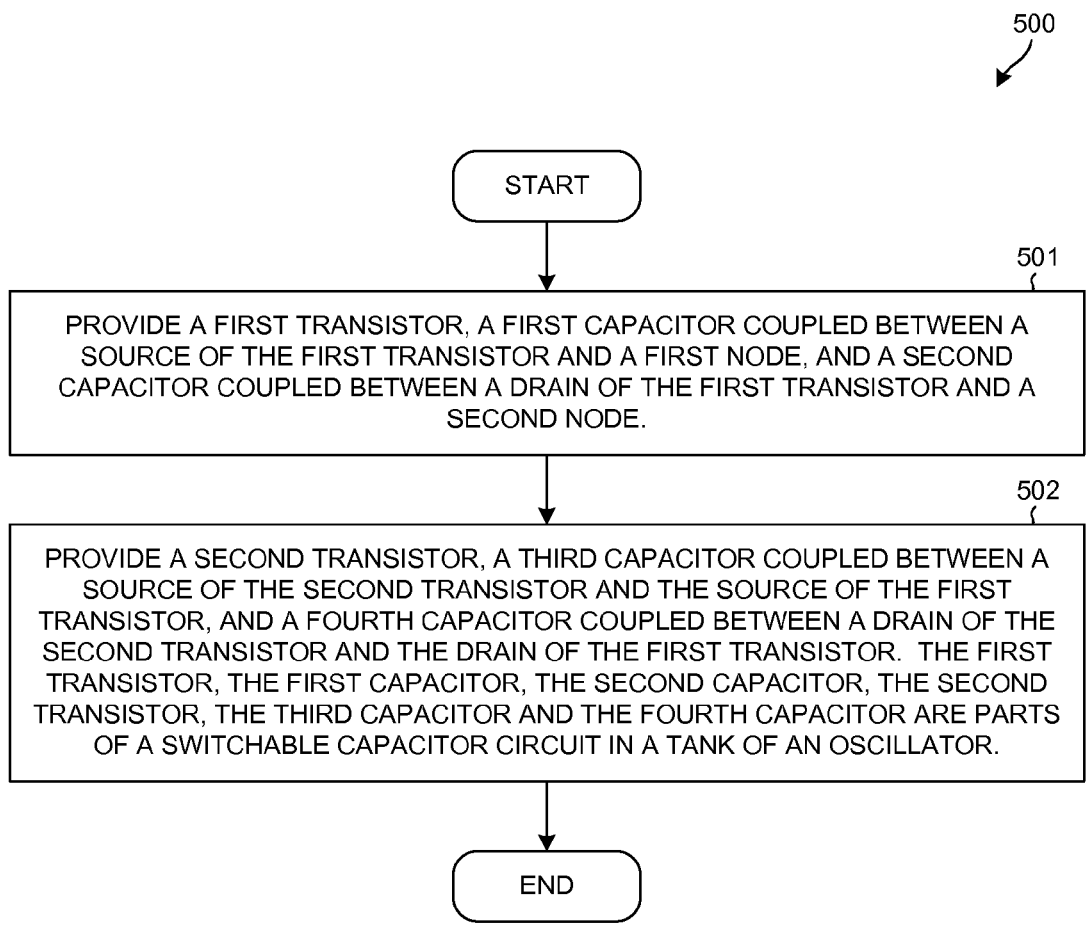
FIG. 25 is a flowchart of a method for protecting the main transistor in a switchable capacitor circuit using a capacitive voltage dividing circuit.

FIG. 25 is a flowchart of a method 500 for protecting the main transistor in a switchable capacitor circuit from breakdown and from damage due to high voltages. A first transistor, a first capacitor, and a second capacitor are provided (step 501). In one example, the first transistor is first transistor 400, the first capacitor is first capacitor 401, and the second capacitor is second capacitor 402 of FIG. 20. The first transistor is coupled between a first node and the source of the first transistor. The second transistor is coupled between the drain of the first transistor and a second node. A second transistor, a third capacitor, and a fourth capacitor are provided (step 502). When the second transistor is on and conductive, a capacitive voltage divider is formed between the first node and the second node. The capacitive voltage divider involves a series-coupling of the first capacitor, the series equivalent of the third and fourth capacitors, and the second capacitor. This capacitive voltage divider serves to reduce the maximum voltage across the first main transistor when the first main transistor is off. In one example, the second transistor is second transistor 407, the third capacitor is third capacitor 408, and the fourth capacitor is fourth capacitor 409 of FIG. 20. In one example, the second transistor can be turned on for operation in a first mode (a high voltage and low phase noise mode), and the second transistor can be turned off for operation in a second mode (a low voltage and lower power mode).

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media. In one specific example, memory 208 of FIG. 5 is a processor-readable medium that stores a set of processor-readable instructions 209. Processor 210 reads and executes the processor-readable instructions, thereby controlling the VCO 139 via serial bus interface 211, serial bus 123, serial bus interface 124, and the digital control signals ON, ONB, EN[1:N], and ENB[1:N]. Processor 210 controls the VCO 139 in this way such that the method of FIG. 18 and the method of FIG. 25 are carried out. Processor 210 coarse tunes the VCO 139, and causes the VCO to switch between the high voltage first mode and the low power second mode.

Although certain specific embodiments are described above for instructional purposes, the teachings of this patent document have general applicability and are not limited to the specific embodiments described above. Accordingly, various modifications, adaptations, and combinations of the various features of the described specific embodiments can be practiced without departing from the scope of the claims that are set forth below.

What is claimed is:

1. A circuit comprising:
a fine tune varactor circuit, the fine varactor circuit including:
   a first varactor having a first terminal and a second terminal;
   a second varactor having a first terminal and a second terminal, wherein the second terminal of the second varactor and the second terminal of the first varactor are coupled together at a third node;
   a third varactor having a first terminal and a second terminal, wherein the first terminal of the third varactor and the first terminal of the first varactor are coupled together at a first node; and
   a fourth varactor having a first terminal and a second terminal, wherein the first terminal of the fourth varactor and the first terminal of the second varactor are coupled together at a second node, wherein the second terminal of the fourth varactor and the second terminal of the third varactor are coupled together at a fourth node; and
a coarse tune capacitor circuit connected to the first varactor via the first node and connected to the second varactor via the second node, wherein the coarse tune capacitor circuit includes a plurality of switchable capacitor circuits, wherein a first of the plurality of switchable capacitor circuits includes:
   a first transistor responsive to a first pair of control signals that is generated by a digital baseband integrated circuit, wherein the first pair of control signals is unique to the first of the plurality of switchable capacitor circuits; and
   a second transistor connected in parallel with a path that includes the first transistor, wherein the second transistor is responsive to a second pair of control signals that is generated by the digital baseband integrated circuit, wherein the second pair of control signals is common to each of the plurality of switchable capacitor circuits, and wherein each signal of the first pair of control signals and each signal of the second pair of control signals is generated independently.

2. The circuit of claim 1, wherein the first terminal of the first varactor is a gate terminal, wherein the first terminal of the second varactor is a gate terminal, wherein the first terminal of the third varactor is a gate terminal, and wherein the first terminal of the fourth varactor is a gate terminal.

3. The circuit of claim 1, wherein the second terminal of the first varactor is a source/drain terminal, wherein the second terminal of the second varactor is a source/drain terminal, wherein the second terminal of the third varactor is a source/drain terminal, and wherein the second terminal of the fourth varactor is a source/drain terminal.

4. The circuit of claim 1, further comprising:
a tuning voltage input conductor that supplies a tuning voltage onto the third node; and
a temperature compensation voltage input conductor that supplies a temperature compensation voltage onto the fourth node.

5. The circuit of claim 1, further comprising:
a bias node;
first bias resistor that resistively couples the bias node to the first node; and
a second bias resistor that resistively couples the bias node to the second node.

6. The circuit of claim 1, wherein the fine tune varactor circuit and the coarse tune capacitor circuit are parts of an LC tank of a Voltage-Controlled Oscillator (VCO) having an input configured to receive a voltage signal, and wherein the first pair of control signals and the second pair of control signals are different from the voltage signal.

7. The circuit of claim 1, wherein the first varactor is an N-channel transistor structure whose source and drain regions are coupled together, wherein the second varactor is an N-channel transistor structure whose source and drain regions are coupled together, wherein the third varactor is a P-channel transistor structure whose source and drain regions are coupled together, and wherein the fourth varactor is a P-channel transistor structure whose source and drain regions are coupled together.

8. The circuit of claim 1, further comprising a voltage generating circuit that supplies a voltage signal onto the fourth node, wherein the voltage signal decreases with increasing temperature.

9. The circuit of claim 1, wherein the first and second varactors have channel regions of a first conductivity type, wherein the third and fourth varactors have channel regions of a second conductivity type opposite the first conductivity type, and wherein the third node receives as an input a voltage signal generated by a loop filter circuit.

10. The circuit of claim 1, further comprising:
a temperature compensation voltage input conductor that supplies a temperature compensation voltage onto the fourth node.

11. The circuit of claim 1, wherein the first varactor has a capacitance-voltage characteristic from the first node to the third node that has a first slope, wherein the third varactor has a capacitance-voltage characteristic from the first node to the fourth node that has a second slope, wherein the first slope is of opposite sign to the second slope, and wherein the third node receives as an input a voltage signal generated by a loop filter circuit.

12. A circuit comprising:
a fine tune varactor circuit, the fine tune varactor circuit including:
a first varactor having a first terminal and a second terminal;
a second varactor having a first terminal and a second terminal, wherein the second terminal of the second varactor and the second terminal of the first varactor are coupled together at a third node;
a third varactor having a first terminal and a second terminal, wherein the second terminal of the third varactor and the first terminal of the first varactor are coupled together at a first node; and
a fourth varactor having a first terminal and a second terminal, wherein the second terminal of the fourth varactor and the first terminal of the second varactor are coupled together at a second node, wherein the first terminal of the fourth varactor and the first terminal of the third varactor are coupled together at a fourth node; and
a coarse tune capacitor circuit connected to the first varactor via the first node and connected to the second varactor via the second node, wherein the coarse tune capacitor circuit includes a plurality of switchable capacitor circuits, wherein a first of the plurality of switchable capacitor circuits includes:
a first transistor responsive to a first pair of control signals that is generated by a digital baseband integrated circuit, wherein the first pair of control signals is unique to the first of the plurality of switchable capacitor circuits; and
a second transistor connected in parallel with a path that includes the first transistor, wherein the second transistor is responsive to a second pair of control signals that is generated by the digital baseband integrated circuit, wherein the second pair of control signals is common to each of the plurality of switchable capacitor circuits, and wherein each signal of the first pair of control signals and each signal of the second pair of control signals is generated independently.

13. The circuit of claim 12, wherein the first varactor has a channel region of a conductivity type, wherein the second varactor has a channel region of the conductivity type, wherein the third varactor has a channel region of the conductivity type, wherein the fourth varactor has a channel region of the conductivity type, and wherein the conductivity type is selected from the group consisting of N-type conductivity, and P-type conductivity.

14. The circuit of claim 12, wherein the second terminal of the first varactor is a source/drain terminal, wherein the second terminal of the second varactor is a source or a drain terminal, wherein the second terminal of the third varactor is a source or a drain terminal, and wherein the second terminal of the fourth varactor is a source or a drain terminal.

15. The circuit of claim 12, further comprising a temperature compensation voltage input conductor that supplies a temperature compensation voltage onto the fourth node.

16. The circuit of claim 12 further comprising:
a bias node;
a first bias resistor that resistively couples the bias node to the first node; and
a second bias resistor that resistively couples the bias node to the second node.

17. The circuit of claim 12, wherein the fine tune varactor circuit and the coarse tune capacitor circuit are parts of an LC tank of a Voltage-Controlled Oscillator (VCO).

18. The circuit of claim 12, wherein the first varactor is an N-channel transistor structure whose source and drain regions are coupled together, wherein the second varactor is an N-channel transistor structure whose source and drain regions are coupled together, wherein the third varactor is a N-channel transistor structure whose source and drain regions are coupled together, and wherein the fourth varactor is a N-channel transistor structure whose source and drain regions are coupled together.

19. The circuit of claim 12, a voltage generating circuit that supplies a voltage signal onto the fourth node, wherein the voltage signal decreases with increasing temperature.

20. The circuit of claim 12, wherein the first terminals of the first, second, third and fourth varactors are gate terminals, and wherein the third node receives as an input a voltage signal generated by a loop filter circuit.

21. A method comprising:
tuning a Voltage-Controlled Oscillator (VCO) by supplying a voltage signal onto a third node of a first varactor circuit of a fine tune varactor circuit of the VCO, wherein the first varactor circuit provides a first capacitance between a first node and a second node;
temperature compensating the VCO by supplying a temperature compensation signal to a fourth node of a second varactor circuit of the fine tune varactor circuit, wherein the second varactor circuit is coupled in parallel with the first varactor circuit such that the second varactor circuit provides a second capacitance between the first node and the second node; and
selectively supplying a third capacitance to the VCO via a coarse tune capacitor circuit connected to the first varactor via the first node and connected to the second varactor via the second node, wherein the coarse tune capacitor circuit includes a plurality of switchable capacitor circuits, wherein a first of the plurality of switchable capacitor circuits includes:
a first transistor responsive to a first pair of control signals that is generated by a digital baseband integrated circuit, wherein the first pair of control signals is unique to the first of the plurality of switchable capacitor circuits; and
a second transistor connected in parallel with a path that includes the first transistor, wherein the second transistor is responsive to a second pair of control signals that is generated by the digital baseband integrated circuit, wherein the second pair of control signals is common to each of the plurality of switchable capacitor circuits, and wherein each signal of the first pair of control signals and each signal of the second pair of control signals are generated independently.

22. The method of claim 21, wherein the first varactor circuit includes a pair of first varactors, wherein each of the first varactors has a channel region of a first conductivity type, wherein the second varactor circuit includes a pair of second varactors, wherein each of the second varactors has a channel region of a second conductivity type opposite the first conductivity type.

23. The method of claim 21, wherein the first varactor circuit includes a pair of first varactors, wherein one of the first varactors has a gate terminal that is coupled to the first node, wherein the second varactor circuit includes a pair of second varactors, wherein one of the second varactors has a gate terminal that is coupled to the fourth node.

24. The method of claim 21, wherein the first varactor circuit has a first capacitance-voltage characteristic of a first slope, wherein the capacitance of the first characteristic is from the first node to the second node and where the voltage of the first characteristic is a common mode voltage between the first node and the third node, wherein the second varactor circuit has a second capacitance-voltage characteristic of a second slope where the capacitance of the second characteristic is from the first node to the second node and where the voltage of the second characteristic is a common mode voltage between the first node and the fourth node, and wherein the first slope and the second slope are of substantially opposite sign.

25. A method comprising:
tuning a Voltage-Controlled Oscillator (VCO) via a main varactor circuit between a first node and a second node, wherein the main varactor circuit includes a first varactor having a first terminal coupled to the first node and a second terminal coupled to a third node, wherein the main varactor circuit further includes a second varactor having a first terminal coupled to the second node and a second terminal coupled to the third node; and
receiving a temperature compensation signal at a temperature compensation varactor circuit between the first node and the second node, wherein the temperature compensation varactor circuit includes a third varactor having a first terminal coupled to the first node and a second terminal coupled to a fourth node, wherein the temperature compensation varactor circuit further includes a fourth varactor having a first terminal coupled to the second node and a second terminal coupled to the fourth node; and
selectively supplying a third capacitance to the VCO via a coarse tune capacitor circuit connected to the first varactor via the first node and connected to the second varactor via the second node, wherein the coarse tune capacitor circuit includes a plurality of switchable capacitor circuits, wherein a first of the plurality of switchable capacitor circuits includes:
a first transistor responsive to a first pair of control signals that is generated by a digital baseband integrated circuit, wherein the first pair of control signals is unique to the first of the plurality of switchable capacitor circuits; and
a second transistor connected in parallel with the first transistor, wherein the second transistor is responsive to a second pair of control signals that is generated by the digital baseband integrated circuit, wherein the second pair of control signals is common to each of the plurality of switchable capacitor circuits, and wherein each signal of the first pair of control signals and each signal of the second pair of control signals are generated independently.

26. The method of claim 25, wherein the first and second varactors have channel regions of a first conductivity type, and wherein the third and fourth varactors have channel regions of a second conductivity type opposite the first conductivity type.

27. The method of claim 25, wherein the first terminal of the first varactor is a gate terminal, wherein the first terminal of the second varactor is a gate terminal, wherein the second terminal of the third varactor is a gate terminal, and wherein the second terminal of the fourth varactor is a gate terminal.

28. The method of claim 25, wherein the first varactor is an N-channel transistor structure whose source and drain regions are coupled together, wherein the second varactor is an N-channel transistor structure whose source and drain regions are coupled together, wherein the third varactor is a P-channel transistor structure whose source and drain regions are coupled together, wherein the fourth varactor is a P-channel transistor structure whose source and drain regions are coupled together.

29. The method of claim 25, wherein the first varactor is an N-channel transistor structure whose source and drain regions are coupled together, wherein the second varactor is an N-channel transistor structure whose source and drain regions are coupled together, wherein the third varactor is a N-channel transistor structure whose source and drain regions are coupled together, wherein the fourth varactor is a N-channel transistor structure whose source and drain regions are coupled together.

30. The method of claim 25, wherein a loop filter circuit supplies a voltage signal onto the third node, wherein the first varactor has a capacitance-voltage characteristic from the first node to the third node of a first slope, wherein the third varactor has a capacitance-voltage characteristic from the first node to the fourth node of a second slope, and wherein the second slope has a sign that is opposite to a sign of the first slope.

31. The method of claim 25, further comprising:
resistively coupling the first node to a bias node through a first resistor; and
resistively coupling the second node to the bias node through a second resistor.

32. The method of claim 25, wherein the temperature compensation signal is a CTAT (Complementary To Absolute Temperature) voltage signal.

33. The method of claim 25, wherein the temperature compensation signal decreases with increasing temperature.

34. A circuit comprising:
a fine tune varactor circuit, the fine tune varactor circuit including:

a main varactor circuit coupled between a first node and a second node, wherein the main varactor circuit receives a voltage signal on a tuning voltage input conductor; and means for temperature compensating the main varactor circuit, wherein the means is coupled in parallel with the main varactor circuit between the first node and the second node, wherein the means is also for receiving a temperature compensation voltage on a temperature compensation voltage input conductor; and a coarse tune capacitor circuit connected to the main varactor circuit, wherein the coarse tune capacitor circuit includes a plurality of switchable capacitor circuits, wherein a first of the plurality of switchable capacitor circuits includes:

a first transistor responsive to a first pair of control signals that is generated by a digital baseband integrated circuit, wherein the first pair of control signals is unique to the first of the plurality of switchable capacitor circuits; and a second transistor connected in parallel with a path that includes the first transistor, wherein the second transistor is responsive to a second pair of control signals that is generated by the digital baseband integrated circuit, wherein the second pair of control signals is common to each of the plurality of switchable capacitor circuits, and wherein each signal of the first pair of control signals and each signal of the second pair of control signals are generated independently.

35. The circuit of claim 34, wherein the main varactor circuit comprises a first varactor and a second varactor, wherein the first and second varactors have channel regions of a first conductivity type, wherein the means comprises a third varactor and a fourth varactor, and wherein the third and fourth varactors have channel regions of a second conductivity type opposite the first conductivity type.

36. The circuit of claim 34, wherein the main varactor circuit comprises a first varactor and a second varactor, wherein a gate terminal of the first varactor is coupled to the first node, wherein a gate terminal of the second varactor is coupled to the second node, wherein the means comprises a third varactor and a fourth varactor, wherein a gate terminal of the third varactor is coupled to a gate terminal of the fourth varactor.

37. The circuit of claim 34, wherein the main varactor circuit has a capacitance-voltage characteristic of a first slope for a capacitance between the first and second nodes assuming a fixed voltage on the tuning voltage input conductor, wherein the means has a capacitance-voltage characteristic of a second slope for a capacitance between the first and second nodes assuming a fixed voltage on the temperature compensation voltage input conductor, and wherein the second slope has a sign that is opposite to a sign of the first slope.

38. A digitally programmable capacitor comprising:

a plurality of switchable capacitor circuits, wherein the plurality of switchable capacitor circuits selectively supply a capacitance to an element of a Voltage-Controlled Oscillator (VCO) that receives as an input a voltage signal, wherein a first of the plurality of switchable capacitor circuits comprises:

a first transistor responsive to a first pair of control signals generated by a digital baseband integrated circuit, wherein the first pair of control signals is unique to the first of the plurality of switchable capacitor circuits;

a first capacitor having a lead coupled to a source of the first transistor;

a second capacitor having a lead coupled to a drain of the first transistor; and a capacitive voltage divider connected in parallel with a path that includes the first transistor, the capacitive voltage divider including:

a second transistor;

a third capacitor having a first lead coupled to a source of the second transistor, wherein the third capacitor has a second lead coupled to the source of the first transistor; and a fourth capacitor having a first lead coupled to a drain of the second transistor, wherein the fourth capacitor has a second lead coupled to the drain of the first transistor, wherein the capacitive voltage divider is configured to reduce a voltage drop across the first transistor when the first transistor is turned off and the second transistor is turned on, wherein the capacitive voltage divider is responsive to a second pair of control signals that is generated by the digital baseband integrated circuit, wherein the second pair of control signals is common to each of the plurality of switchable capacitor circuits, wherein each signal of the first pair of control signals and each signal of the second pair of control signals are generated independently, and wherein the first pair of control signals and the second pair of control signals are different from the voltage signal.

39. The digitally programmable capacitor of claim 38, wherein a second of the plurality of switchable capacitor circuits comprises:

a third transistor responsive to a third pair of control signals, wherein the third pair of control signals is unique to the second of the plurality of switchable capacitor circuits;

a fifth capacitor having a lead coupled to a source of the third transistor, wherein a second lead of the fifth capacitor of the second switchable capacitor circuit is coupled to a second lead of the first capacitor of the first switchable capacitor circuit;

a sixth capacitor having a lead coupled to a drain of the third transistor, wherein a second lead of the sixth capacitor of the second switchable capacitor circuit is coupled to a second lead of the second capacitor of the first switchable capacitor circuit;

a fourth transistor;

a seventh capacitor having a first lead coupled to a source of the fourth transistor, and wherein the seventh capacitor has a second lead coupled to the source of the third transistor; and an eighth capacitor having a first lead coupled to a drain of the fourth transistor, and wherein the eighth capacitor has a second lead coupled to the drain of the third transistor.

40. The digitally programmable capacitor of claim 39, further comprising:

an input signal conductor that is resistively coupled to a gate of the second transistor of the first switchable capacitor circuit and to a gate of the fourth transistor of the second switchable capacitor circuit.

41. The digitally programmable capacitor of claim 39, further comprising:

a plurality of input signal conductors, wherein a first digital signal present on a first of the plurality of input signal conductors is supplied to a gate of the first transistor of the first switchable capacitor circuit, and wherein a second digital signal present on a second of the plurality of input signal conductors is supplied to a gate of the third transistor of the second switchable capacitor circuit.

42. The digitally programmable capacitor of claim 41, wherein the first digital signal is supplied through a first resistor to the gate of the first transistor of the first switchable capacitor circuit, and wherein the second digital signal is supplied through a second resistor to the gate of the third transistor of the second switchable capacitor circuit.

43. The digitally programmable capacitor of claim 38, wherein the digitally programmable capacitor is part of an LC tank of the Voltage-Controlled Oscillator (VCO).

44. The digitally programmable capacitor of claim 38, wherein the voltage signal is supplied by a loop filter circuit, and wherein the capacitive voltage divider is configured to reduce a voltage drop across the first transistor when the first transistor is turned off and the second transistor turned on.

45. A method comprising:
selectively supplying a capacitance from a plurality of switchable capacitor circuits to an element of a Voltage-Controlled Oscillator (VCO) that receives as an input a voltage signal from a loop filter circuit, wherein a first of the plurality of switchable capacitor circuits includes:
a first transistor responsive to a first pair of control signals generated by a digital baseband integrated circuit, wherein the first pair of control signals is unique to the first transistor;
a first capacitor coupled between a source of the first transistor and a first node;
a second capacitor coupled between a drain of the first transistor and a second node; and
a capacitive voltage divider connected in parallel with the first transistor, the capacitive voltage divider including:
a second transistor;
a third capacitor coupled between a source of the second transistor and the source of the first transistor; and
a fourth capacitor coupled between a drain of the second transistor and a drain of the first transistor, wherein the capacitive voltage divider is configured to reduce a voltage drop across the first transistor when the first transistor is turned off and the second transistor is turned on, and wherein the capacitive voltage divider is responsive to a second pair of control signals that is generated by the digital baseband integrated circuit, wherein the second pair of control signals is common to each of the plurality of switchable capacitor circuits, wherein each signal of the first pair of control signals and each signal of the second pair of control signals are generated independently, and wherein the first pair of controls control signals and the second pair of control signals are different from the voltage signal.

46. The method of claim 45, wherein a second of the plurality of switchable capacitor circuits includes:
a third transistor;
a fifth capacitor coupled between a source of the third transistor and the first node;
a sixth capacitor coupled between a drain of the third transistor and the second node;
a fourth transistor;
a seventh capacitor coupled between a source of the fourth transistor and the source of the third transistor; and
an eighth capacitor coupled between a drain of the fourth transistor and a drain of the third transistor.

47. The method of claim 46, wherein the first and second switchable capacitor circuits are parts of a digitally programmable capacitor, wherein the digitally programmable capacitor is a part of a tank, and wherein the tank is a part of the VCO.

48. The method of claim 47, wherein a first signal of the first pair of control signals is supplied onto a gate of the first transistor and, wherein a first signal of the second pair of control signals is supplied onto a gate of the second transistor.

49. The method of claim 48, further comprising:
resistively coupling a gate of the second transistor to a first signal of the second pair of control signals; and
resistively coupling a gate of the fourth transistor to the first signal of the second pair of control signals.

50. A circuit comprising:
a plurality of switchable capacitor circuits, wherein the plurality of switchable capacitor circuits selectively supply a capacitance to a Voltage-Controlled Oscillator (VCO) that receives as an input a voltage signal, wherein a first of the plurality of switchable capacitor circuits comprises:
a first transistor responsive to a first pair of control signals generated by a digital baseband integrated circuit, wherein the first pair of control signals is unique to the first of the plurality of switchable capacitor circuits;
a first capacitor having a lead coupled to a source of the first transistor;
a second capacitor having a lead coupled to a drain of the first transistor; and
first means for providing a first capacitance in a first mode between the source of the first transistor and the drain of the first transistor and for disconnecting the first capacitance in a second mode such that the first capacitance is not provided between the source of the first transistor and the drain of the first transistor, wherein the first means is connected in parallel with a path that includes the first transistor, wherein the first means is responsive to a second pair of control signals that is generated by the digital baseband integrated circuit, wherein the second pair of control signals is common to each of the plurality of switchable capacitor circuits, wherein each signal of the first pair of control signals and each signal of the second pair of control signals are generated independently, and wherein the first pair of control signals and the second pair of control signals are different from the voltage signal.

51. The circuit of claim 50, wherein the first means includes a second transistor that is on in the first mode and is off in the second mode, wherein the first means further comprises a third capacitor coupled between a source of the second transistor and the source of the first transistor, and wherein the first means further comprises a fourth capacitor coupled between a drain of the second transistor and the drain of the first transistor.

52. The circuit of claim 50, wherein a second of the plurality of switchable capacitor circuits comprises:
a second transistor responsive to a third pair of control signals that is unique to the second of the plurality of switchable capacitor circuits;
a third capacitor having a lead coupled to a source of the second transistor;
a fourth capacitor having a lead coupled to a drain of the second transistor; and
second means for providing a second capacitance in the first mode between the source of the second transistor and the drain of the second transistor, and for disconnecting the second capacitance in the second mode such that the second capacitance is not provided between the source of the second transistor and the drain of the second transistor.

53. The circuit of claim 52, wherein the first capacitor has a second lead that is coupled to a second lead of the third capacitor, and wherein the second capacitor has a second lead that is coupled to a second lead of the fourth capacitor.

54. The circuit of claim 50, wherein the voltage signal is supplied by a loop filter circuit.

* * * * *